(12) United States Patent
Lim et al.

(10) Patent No.: US 11,790,988 B2
(45) Date of Patent: Oct. 17, 2023

(54) NONVOLATILE MEMORY DEVICE INCLUDING TEMPERATURE COMPENSATION CIRCUIT

(71) Applicant: SAMSUNG ELECTRONICS CO., LTD., Suwon-si (KR)

(72) Inventors: Ji-Hoon Lim, Hwaseong-si (KR); Bilal Ahmad Janjua, Suwon-si (KR)

(73) Assignee: Samsung Electronics Co., Ltd.

( * ) Notice: Subject to any disclaimer, the term of this patent is extended or adjusted under 35 U.S.C. 154(b) by 292 days.

(21) Appl. No.: 17/350,292

(22) Filed: Jun. 17, 2021

(65) Prior Publication Data

US 2021/0312982 A1  Oct. 7, 2021

Related U.S. Application Data

(62) Division of application No. 16/846,528, filed on Apr. 13, 2020, now Pat. No. 11,069,406.

(30) Foreign Application Priority Data

Jul. 4, 2019  (KR) .................. 10-2019-0080879

(51) Int. Cl.
*G11C 11/00* (2006.01)
*G11C 13/00* (2006.01)
*G05F 3/26* (2006.01)

(52) U.S. Cl.
CPC .......... *G11C 13/0038* (2013.01); *G05F 3/262* (2013.01); *G11C 13/004* (2013.01); *G11C 13/0004* (2013.01); *G11C 13/0026* (2013.01); *G11C 13/0028* (2013.01); *G11C 13/0069* (2013.01); *G11C 13/003* (2013.01); *G11C 2013/0045* (2013.01); *G11C 2013/0078* (2013.01); *G11C 2213/72* (2013.01)

(58) Field of Classification Search
CPC ............ G11C 13/0038; G11C 13/0004; G11C 13/0026; G11C 13/0028
USPC ........................................................ 365/163
See application file for complete search history.

(56) References Cited

U.S. PATENT DOCUMENTS

| | | |
|---|---|---|
| 5,200,654 A | 4/1993 | Archer |
| 7,173,844 B2 | 2/2007 | Lee et al. |
| 7,324,570 B2 | 1/2008 | Moran |
| 8,067,992 B2 | 11/2011 | Chen et al. |
| 8,483,001 B2 | 7/2013 | Kim et al. |

(Continued)

FOREIGN PATENT DOCUMENTS

JP    2004-015423 A    1/2004

*Primary Examiner* — Vu A Le
(74) *Attorney, Agent, or Firm* — Fish & Richardson P.C.

(57) ABSTRACT

A nonvolatile memory device includes a differential current driver that receives a first differential signal and a second differential signal, which are based on a temperature, and generates a first compensation current and a second compensation current corresponding to a difference value between the first and second differential signals. A current mirror circuit copies a first current, which is a sum of a reference current and the first compensation current, to generate a second current having a same value as a value of the first current and regulates the reference current depending on a difference value of the second current and the second compensation current. A trimming circuit generates a program current or a read current based on the regulated reference current.

15 Claims, 14 Drawing Sheets

(56) References Cited

U.S. PATENT DOCUMENTS

| | | |
|---|---|---|
| 9,977,111 B2 | 5/2018 | Li |
| 2003/0214277 A1 | 11/2003 | Reimann |
| 2006/0028890 A1 | 2/2006 | Lee et al. |
| 2013/0188431 A1* | 7/2013 | Scheuerlein ........ G11C 13/0011 |
| | | 365/189.011 |
| 2015/0092470 A1* | 4/2015 | Vimercati ................ G11C 7/14 |
| | | 365/163 |
| 2015/0221365 A1* | 8/2015 | Park ................... G11C 13/0002 |
| | | 365/163 |

* cited by examiner

NONVOLATILE MEMORY DEVICE INCLUDING TEMPERATURE COMPENSATION CIRCUIT

CROSS-REFERENCE TO RELATED APPLICATIONS

This is a Divisional of U.S. application Ser. No. 16/846,528, filed Apr. 13, 2020, and a claim of priority under 35 U.S.C. § 119 is made to Korean Patent Application No. 10-2019-0080879 filed on Jul. 4, 2019, in the Korean Intellectual Property Office, the disclosures of which are incorporated by reference herein in their entireties.

BACKGROUND

Embodiments of the disclosure described herein relate to a semiconductor memory, and more particularly, relate to a nonvolatile memory device including a temperature compensation circuit.

A semiconductor memory includes nonvolatile memories such as a phase change memory, a ferroelectric memory, a magnetic memory, a resistive memory, and a flash memory. In particular, among the nonvolatile memories, the phase change memory may perform a program operation by changing a resistance value of a memory cell through a current or may read data stored in a memory cell through a current.

When the program operation or the read operation is performed on a phase change memory cell, a current for the program operation or the read operation may vary depending on a temperature of the phase change memory. That is, it is necessary to regulate (or adjust) a current for the program operation or the read operation in consideration of a temperature of the phase change memory.

SUMMARY

Embodiments of the disclosure provide a nonvolatile memory device capable of regulating a current of an operation of the nonvolatile memory device depending on a temperature of the nonvolatile memory device.

According to an exemplary embodiment, a nonvolatile memory device includes a differential current driver that receives a first differential signal and a second differential signal, which are based on a temperature, and generates a first compensation current and a second compensation current corresponding to a difference value between the first and second differential signals. A current mirror circuit copies a first current that is a sum of a reference current and the first compensation current to generate a second current having a same value as a value of the first current and regulates the reference current depending on a difference value of the second current and the second compensation current. A trimming circuit generates a program current or a read current based on the regulated reference current.

According to an exemplary embodiment, a nonvolatile memory device includes a memory cell array that includes a plurality of memory cells. A temperature sensor senses a temperature and generates a first differential signal and a second differential signal which are based on the sensed temperature. A reference current generator generates a reference current. A current mirror circuit generates a first compensation current and a second compensation current corresponding to a difference value between the first and second differential signals, copies a first current that is a sum of the reference current and the first compensation current to generate a second current having a same value as a value of the first current, and regulates the reference current depending on a difference value of the second current and the second compensation current. A write driver drives a bit line or a word line connected to the memory cell array based on the regulated reference current.

According to an exemplary embodiment, a nonvolatile memory device includes a memory cell array that includes a plurality of memory cells. A temperature compensation circuit regulates a reference current based on a first differential signal and a second differential signal according to a temperature for driving a bit line or a word line connected to the memory cell array. The temperature compensation circuit includes: (1) a differential current driver that generates a first compensation current and a second compensation current corresponding to a difference value between the first and second differential signals and (2) a current mirror circuit that copies a first current that is a sum of the reference current and the first compensation current to generate a second current having a same value as a value of the first current and generates the regulated reference current corresponding to a difference value of the second current and the second compensation current.

According to an exemplary embodiment, a nonvolatile memory device includes a current source that outputs a bias current having a value corresponding to a temperature compensation magnitude signal. A first transistor is connected to a first output terminal of the current source and outputs a first compensation current based on a first differential signal. A second transistor is connected to the first output terminal of the current source and outputs a second compensation current based on a second differential signal. A third transistor is connected to a second output terminal of the first transistor and outputs a reference current to the second output terminal based on a reference voltage. A fourth transistor is connected to a common output terminal of the first transistor and the third transistor. A fifth transistor is connected to a first gate terminal of the fourth transistor and a third output terminal of the second transistor. A sixth transistor is connected to the third output terminal and outputs a regulated reference current to the third output terminal. The common output terminal, the first gate terminal of the fourth transistor, and a second gate terminal of the fifth transistor are interconnected. A difference value of the first differential signal and the second differential signal is changed depending on a temperature.

BRIEF DESCRIPTION OF THE FIGURES

The above and other objects and features of the disclosure will become apparent by describing in detail exemplary embodiments thereof with reference to the accompanying drawings.

DETAILED DESCRIPTION

Below, embodiments of the disclosure may be described in detail and clearly to such an extent that an ordinary one in the art easily implements the disclosure.

Figure 1:
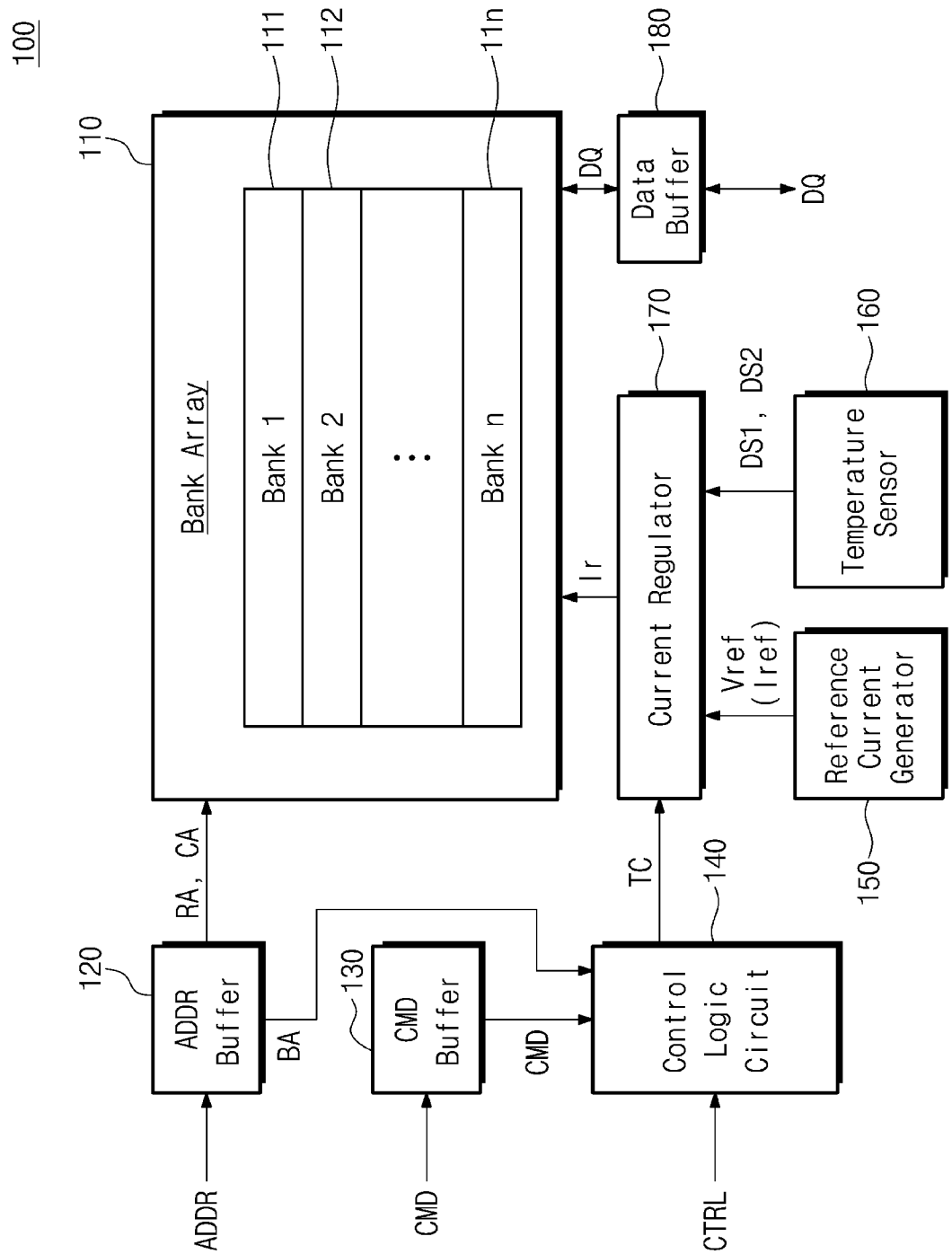
FIG. 1 is a block diagram of a nonvolatile memory device according to an embodiment of the disclosure.

FIG. 1 is a block diagram of a nonvolatile memory device according to an embodiment of the disclosure. Referring to FIG. 1, a nonvolatile memory device 100 may include a bank array 110, an address buffer 120, a command buffer 130, a control logic circuit 140, a reference current generator 150, a temperature sensor 160, a current regulator 170, and a data buffer 180.

The bank array 110 may include first to n-th banks 111 to 11n. Each of the first to n-th banks 111 to 11n may include memory cells for storing data. The first to n-th banks 111 to 11n may perform a program operation or a read operation independently of each other. The program operation may include a set operation of changing a logical value of "0" to a logical value of "1" and a reset operation of changing the logical value of "1" to the logical value of "0". The number of banks included in the bank array 110 is not limited.

The address buffer 120 may receive an address ADDR from an external device. The address buffer 120 may provide a bank address BA of the received address ADDR to the control logic circuit 140. The address buffer 120 may provide a row address RA and a column address CA of the received address ADDR to the bank array 110. The address buffer 120 may provide the row address RA and the column address CA to a bank that the control logic circuit 140 selects based on the bank address BA.

The command buffer 130 may receive a command CMD from the external device. The command buffer 130 may provide the received command CMD to the control logic circuit 140.

The control logic circuit 140 may control an operation of the nonvolatile memory device 100. The control logic circuit 140 may receive a control signal CTRL from the external device. The control logic circuit 140 may receive the bank address BA from the address buffer 120 and may receive the command CMD from the command buffer 130. The control logic circuit 140 may operate based on the control signal CTRL, the bank address BA, and the command CMD.

The control logic circuit 140 may provide a temperature compensation control signal TC to the current regulator 170. For example, the control logic circuit 140 may receive the temperature compensation control signal TC from the external device through the control signal CTRL. The temperature compensation control signal TC is a signal for controlling a value of an operating current Ir that the current regulator 170 generates. As such, the magnitude of the operating current Ir generated from the current regulator 170 may change based on the temperature compensation control signal TC. The temperature compensation control signal TC may be determined depending on a characteristic that is based on a temperature of memory cells of the bank array 110, but the disclosure is not limited thereto.

The reference current generator 150 may generate a reference current Iref for various operations of the nonvolatile memory device 100. For example, a program current for the program operation or a read current for the read operation may be generated based on the reference current Iref. The reference current generator 150 may provide the generated reference current Iref to the current regulator 170. The reference current generator 150 may provide a reference voltage Vref to the current regulator 170 for transferring the reference current Iref to the current regulator 170. The current regulator 170 may receive the reference current Iref based on the provided reference voltage Vref. For example, the reference current generator 150 may include a bandgap reference (BGR) circuit.

The temperature sensor 160 may sense a temperature of the nonvolatile memory device 100. The temperature sensor 160 may generate a first differential signal DS1 and a second differential signal DS2 depending on (based on) the sensed temperature. A difference between the differential signals DS1 and DS2 may vary depending on the sensed temperature. For example, the first and second differential signals DS1 and DS2 may be the same at a reference temperature. In this case, a difference value between the first and second differential signals DS1 and DS2 may increase in a positive direction as the sensed temperature becomes higher than the reference temperature and may increase in a negative direction as the sensed temperature becomes lower than the reference temperature. For example, the differential signals DS1 and DS2 may be voltage signals or current signals. The generated differential signals DS1 and DS2 may be provided to the current regulator 170.

The current regulator 170 may generate the operating current Ir to be provided to the bank array 110 based on the differential signals DS1 and DS2 and the reference current Iref. The current regulator 170 may regulate the reference current Iref depending on a temperature of the nonvolatile memory device 100 and may generate the operating current Ir. In detail, the current regulator 170 may generate compensation currents based on the differential signals DS1 and DS2 and the temperature compensation control signal TC. The current regulator 170 may regulate, adjust, or calibrate the reference current Iref based on the generated compensation currents.

The current regulator 170 may generate the operating current Ir depending on an operation of the nonvolatile memory device 100. For example, when the nonvolatile memory device 100 performs the program operation, the current regulator 170 may generate the operating current Ir corresponding to a program current value. When the nonvolatile memory device 100 performs the read operation, the current regulator 170 may generate the operating current Ir corresponding to a read current value.

The operating current Ir may be provided to the bank array 110. The bank array 110 may perform various operations including the program operation and the read operation, based on the operating current Ir.

The data buffer 180 may exchange data signals DQ with one bank selected from the banks 111 to 11n. Also, the data buffer 180 may exchange the data signals DQ with the external device.

As described above, the nonvolatile memory device 100 may include components (e.g., the reference current generator 150, the temperature sensor 160, and the current regulator 170) that regulate the operating current Ir to be provided to the bank array 110 depending on a temperature of the nonvolatile memory device 100. As such, the nonvolatile memory device 100 may perform various operations based on the operating current Ir that depends on a temperature. For example, the nonvolatile memory device 100 may regulate a program current depending on a temperature and may perform the program operation; alternatively, the nonvolatile memory device 100 may regulate a read current depending on a temperature and may perform the read operation.

Figure 2:
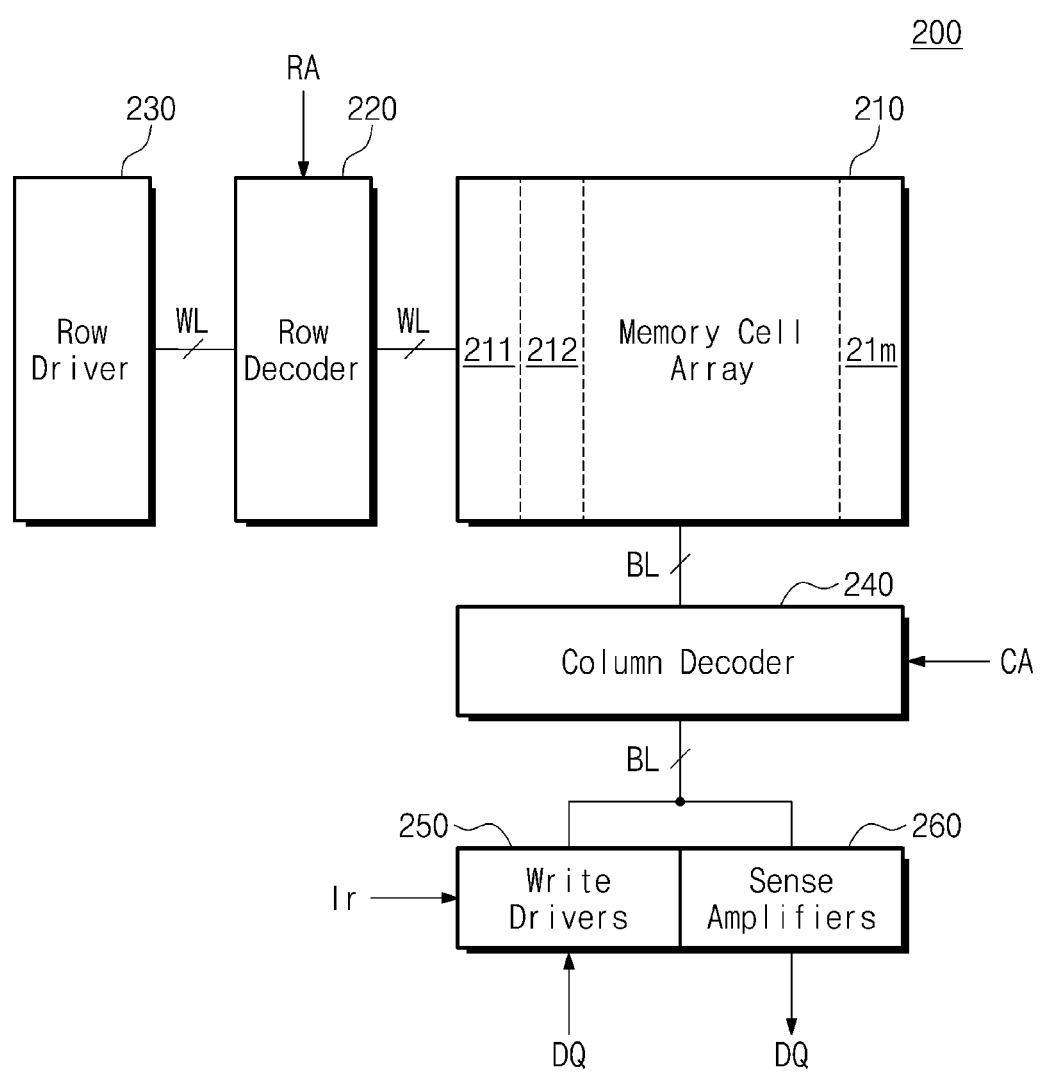
FIG. 2 is a block diagram illustrating an example of a bank of a bank array of FIG. 1.

FIG. 2 is a block diagram illustrating an example of a bank of a bank array of FIG. 1. A bank 200 of FIG. 2 may be one of the first to n-th banks 111 to 11n of FIG. 1. Referring to FIG. 2, the bank 200 may include a memory cell array 210, a row decoder 220, a row driver 230, a column decoder 240, write drivers 250, and sense amplifiers 260.

The memory cell array 210 may include memory cells connected to word lines WL and bit lines BL. For example, memory cells in each row may be connected to one word line. Memory cells in each column may be connected to one bit line BL. For example, the memory cell array 210 may include phase change memory cells.

The memory cell array 210 may be divided into first to m-th cell areas 211 to 21m. Each of the first to m-th cell areas 211 to 21m may include memory cells corresponding to at least one bit line. Here, "m" being the number of divided areas may correspond to the number of write drivers 250. For example, one cell area and one write driver may be defined as one bay in the bank 200.

The row decoder 220 is connected to the memory cell array 210 through the word lines WL. The row decoder 220 may receive the row address RA from the address buffer 120 of FIG. 1. The row decoder 220 may select one of the word lines WL, based on the row address RA. For example, the row decoder 220 may be configured to apply a selection voltage or a selection current to a selected word line. Also, the row decoder 220 may be configured to apply a non-selection voltage or a non-selection current to an unselected word line.

The row driver 230 may apply the selection voltage or the selection current to the word lines WL through the row decoder 220. For example, the row driver 230 may apply a program voltage to the word lines WL in the program operation. The row driver 230 may apply a read voltage to the word lines WL in the read operation.

The column decoder 240 is connected to the memory cell array 210 through the bit lines BL. The column decoder 240 may receive the column address CA from the address buffer 120 of FIG. 1. The column decoder 240 may select at least one of the bit lines BL based on the column address CA. The selected bit line may be driven by the write drivers 250 based on the operating current Ir. For example, in the program operation, the selected bit line may be driven by the write drivers 250 based on a program current. In the read operation, the selected bit line may be driven by the write drivers 250 based on a read current.

The write drivers 250 may drive the bit lines BL based on the operating current Ir. In detail, the write drivers 250 may drive a selected bit line so that the operating current Ir flows to the selected bit line. For example, in the program operation, the write drivers 250 may drive the bit lines BL based on the data signals DQ so that the operating current Ir flows to the bit lines BL. In this case, the operating current Ir may correspond to a program current. As such, data may be written in memory cells connected to the selected word line. For example, in the read operation, the write drivers 250 may drive the bit lines BL so that the operating current Ir flows to the bit lines BL. In this case, the operating current Ir may correspond to a read current.

For example, the write circuits 250 may write data by performing a set operation or a reset operation on selected memory cells and changing resistance values of the selected memory cells.

The sense amplifiers 260 may read data from selected memory cells by sensing voltages of the bit lines BL. For example, the sense amplifiers 260 may read data by determining ranges of resistance values of the selected memory cells based on the sensed voltages. As such, the sense amplifiers 260 may transfer the data signals DQ to the data buffer 180 of FIG. 1.

Figure 3:
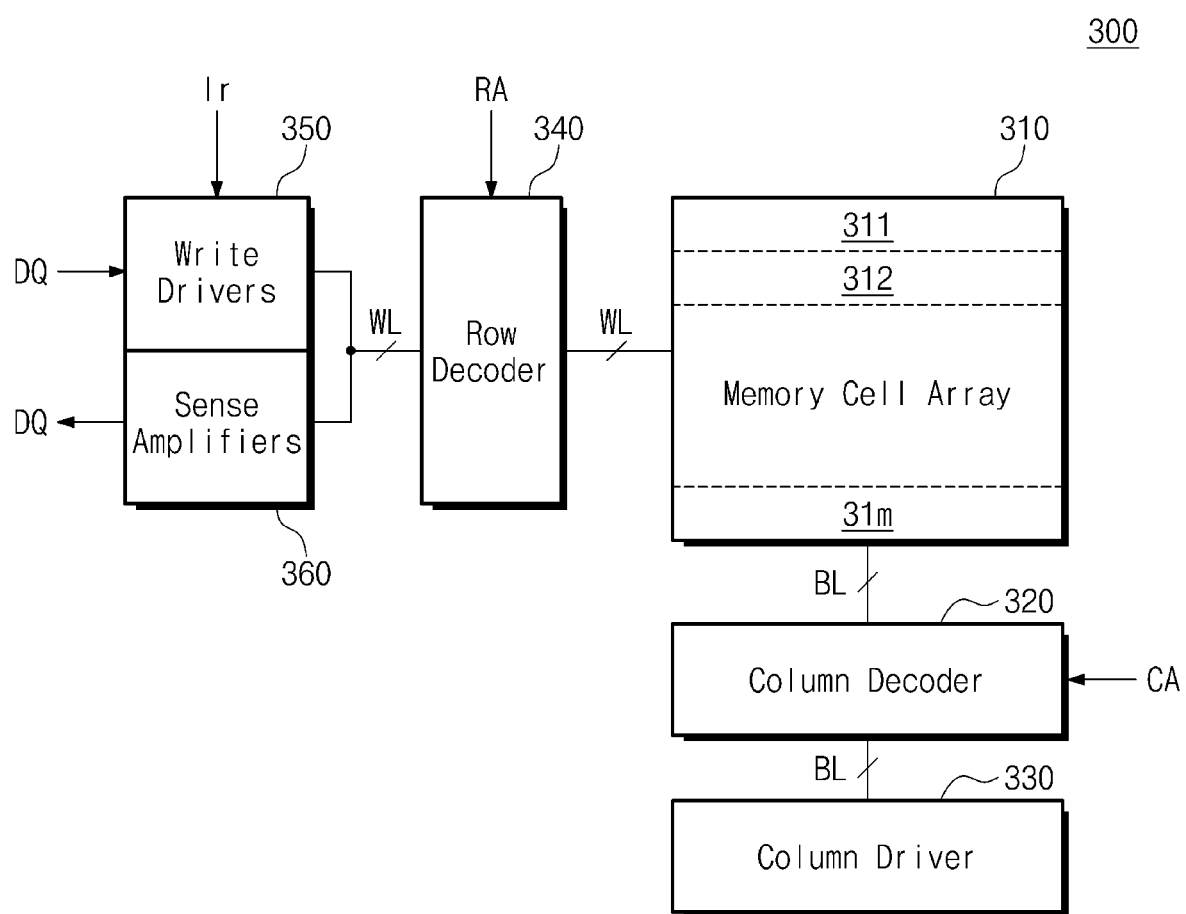
FIG. 3 is a block diagram illustrating another example of a bank of a bank array of FIG. 1.

FIG. 3 is a block diagram illustrating another example of a bank of a bank array of FIG. 1. In an exemplary embodiment, a bank 300 of FIG. 3 may be one of the first to n-th banks 111 to 11n of FIG. 1. Referring to FIG. 3, the bank 300 may include a memory cell array 310, a column decoder 320, a column driver 330, a row decoder 340, write drivers 350, and sense amplifiers 360. An operation of the bank 300 of FIG. 3 is similar to the operation of the bank 200 of FIG. 2, and thus, additional description will be omitted to avoid redundancy.

The memory cell array 310 may be divided into first to m-th cell areas 311 to 31m. Each of the first to m-th cell areas 311 to 31m may include memory cells corresponding to at least word line. Here, "m" being the number of divided areas may correspond to the number of write drivers 350. For example, one cell area and one write driver may be defined as one bay in the bank 300.

The column decoder 320 may select at least one of the bit lines BL based on the column address CA. For example, the column decoder 320 may be configured to apply a selection voltage or a selection current to a selected bit line. Also, the column decoder 320 may be configured to apply a non-selection voltage or a non-selection current to an unselected bit line.

The column driver 330 may apply the selection voltage or the selection current to the bit lines BL through the column decoder 320. For example, the column driver 330 may apply a program voltage to the bit lines BL in the program operation. The column driver 330 may apply a read voltage to the bit lines BL in the read operation.

The row decoder 340 may select at least one of the word lines WL based on the row address RA. The selected word line may be driven by the write drivers 350 based on the operating current Ir. For example, in the program operation, the selected word line may be driven by the write drivers 350 based on a program current. In the read operation, the selected word line may be driven by the write drivers 350 based on a read current.

The write drivers 350 may drive the word lines WL based on the operating current Ir. In detail, the write drivers 350 may drive a selected word line so that the operating current Ir flows to the selected word line. For example, in the program operation, the write drivers 350 may drive the word lines WL based on the data signals DQ so that the operating current Ir flows to the word lines WL. In this case, the operating current Ir may correspond to a program current. As such, data may be written in memory cells connected to the selected bit line. For example, in the read operation, the write drivers 350 may drive the word lines WL so that the operating current Ir flows to the word lines WL. In this case, the operating current Ir may correspond to a read current.

The sense amplifiers 360 may read data from selected memory cells by sensing voltages of the word lines WL.

As described above, according to an embodiment of the disclosure, the write drivers 250 or 350 may be disposed so that the operating current Ir flows through either the bit lines BL or the word lines WL. Below, for convenience of description, detailed examples for generating the operating current Ir will be described with reference to the bank 200 of FIG. 2.

Figure 4:
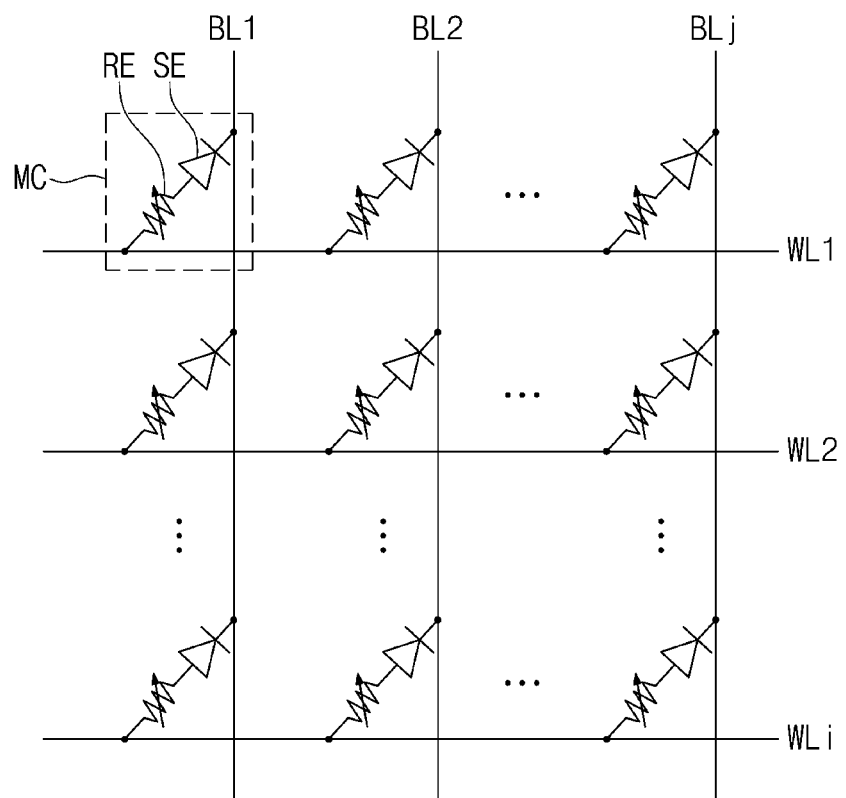
FIG. 4 is an exemplary circuit diagram of a memory cell array of FIG. 2.

FIG. 4 is an exemplary circuit diagram of a memory cell array of FIG. 2. Referring to FIG. 4, the memory cell array 210 includes memory cells MC. The memory cells MC may be arranged in rows and columns. The memory cells MC in the rows may be connected to first to i-th word lines WL1 to WLi. The memory cells MC in the columns may be connected to first to j-th bit lines BL1 to BLj.

Each of the memory cells MC may be connected to one word line and one bit line. Each of the memory cells MC may include a selection element SE and a resistance element RE.

As illustrated in FIG. 4, the resistance element RE may be connected between one of the first to i-th word lines WL1 to WLi and the selection element SE, and the selection element SE may be connected between the resistance element RE and one of the first to j-th bit lines BL1 to BLj. However, the disclosure is not limited thereto. For example, the selection element SE may be connected between one of the first to i-th word lines WL1 to WLi and the resistance element RE, and the resistance element RE may be connected between the selection element SE and one of the first to j-th bit lines BL1 to BLj.

The resistance element RE may have a resistance value which is changed by the set operation or the reset operation. The resistance element RE may include a phase change material, the resistance value of which varies depending on crystal and amorphous states. In detail, the phase change material may have the amorphous state having a relatively great resistance and the crystal state having a relatively small resistance. As a phase of the phase change material is changed by the Joule's heat generated depending on an ambient temperature and a current flowing through the resistance element RE, data may be written in each of the memory cells MC.

An example is illustrated in FIG. 4 as the selection element SE is a diode, but the disclosure is not limited thereto. For example, the selection element SE may be implemented with a switchable element (e.g., a transistor).

Figure 5:
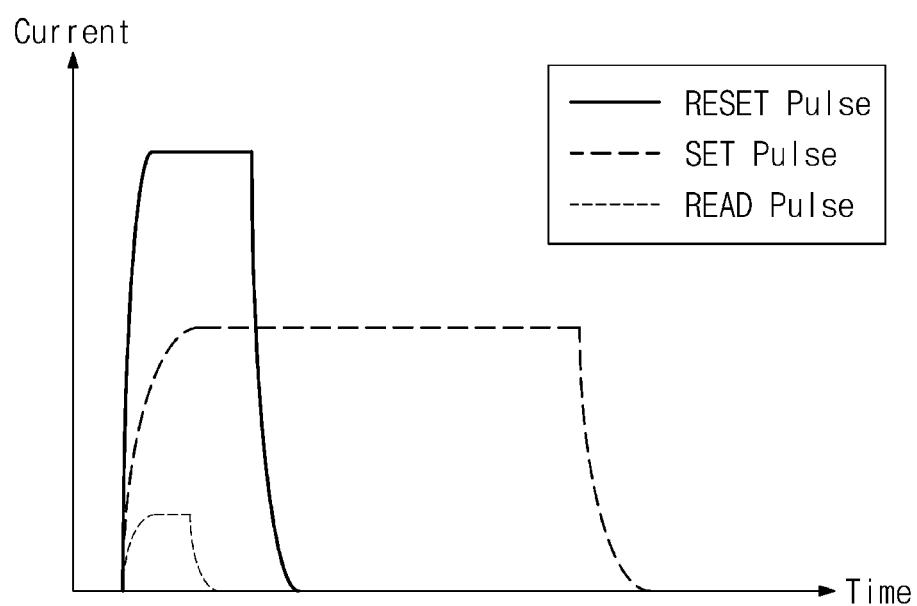
FIG. 5 illustrates an example of a current pulse causing a program operation and a read operation in memory cells of FIG. 4.

FIG. 5 illustrates an example of a current pulse causing a program operation and a read operation in memory cells of FIG. 4. In FIG. 5, a horizontal axis represents time, and a vertical axis represents voltage.

Referring to FIGS. 4 and 5, a RESET pulse and a SET pulse indicate an example of a current pulse flowing through the resistance element RE in the program operation, and a READ pulse indicates an example of a current pulse flowing through the resistance element RE in the read operation. In detail, when a reset operation is performed, the RESET pulse may flow through the resistance element RE of a selected memory cell; when the set operation is performed, the SET pulse may flow through the resistance element RE of the selected memory cell. The RESET pulse may be provided during a shorter time than the SET pulse and may have a higher current level than the SET pulse. When the read operation is performed, the READ pulse may flow through the resistance element RE of the selected memory cell. The READ pulse may have a lower current level than the RESET pulse and the SET pulse.

When the RESET pulse illustrated in FIG. 5 flows through the resistance element RE, a temperature of the resistance element RE may sharply increase during a short time and may sharply decrease. In this case, the phase change material of the resistance element RE may have the amorphous state and may have a high resistance value (i.e., a logical value of "0"). When the SET pulse illustrated in FIG. 5 flows through the resistance element RE, a temperature of the resistance element RE may slowly increase and may slowly decrease. In this case, the phase change material of the resistance element RE may have the crystal state and may have a low resistance value (i.e., a logical value of "1").

When the READ pulse illustrated in FIG. 5 flows through the resistance element RE, a voltage of a bit line may vary depending on a resistance value of the resistance element RE. A data value stored in the selected memory cell may be determined from a voltage value of the bit line.

An example in which data are written in a selected memory cell based on the RESET pulse and the SET pulse having different current levels is described with reference to FIG. 5, but the disclosure is not limited thereto. For example, in the reset operation and the set operation, the resistance element RE may have a melting state by allowing a current of the same level to flow through the resistance element RE. In this case, a resistance value of the resistance element RE may change by differently determining a time to cool the resistance element RE. For example, when the resistance element RE is quickly cooled, the phase change material of the resistance element RE may have an amorphous state and may have a high resistance value. When the resistance element RE is slowly cooled, the phase change material of the resistance element RE may have a crystal state and may have a low resistance value.

Figure 6:
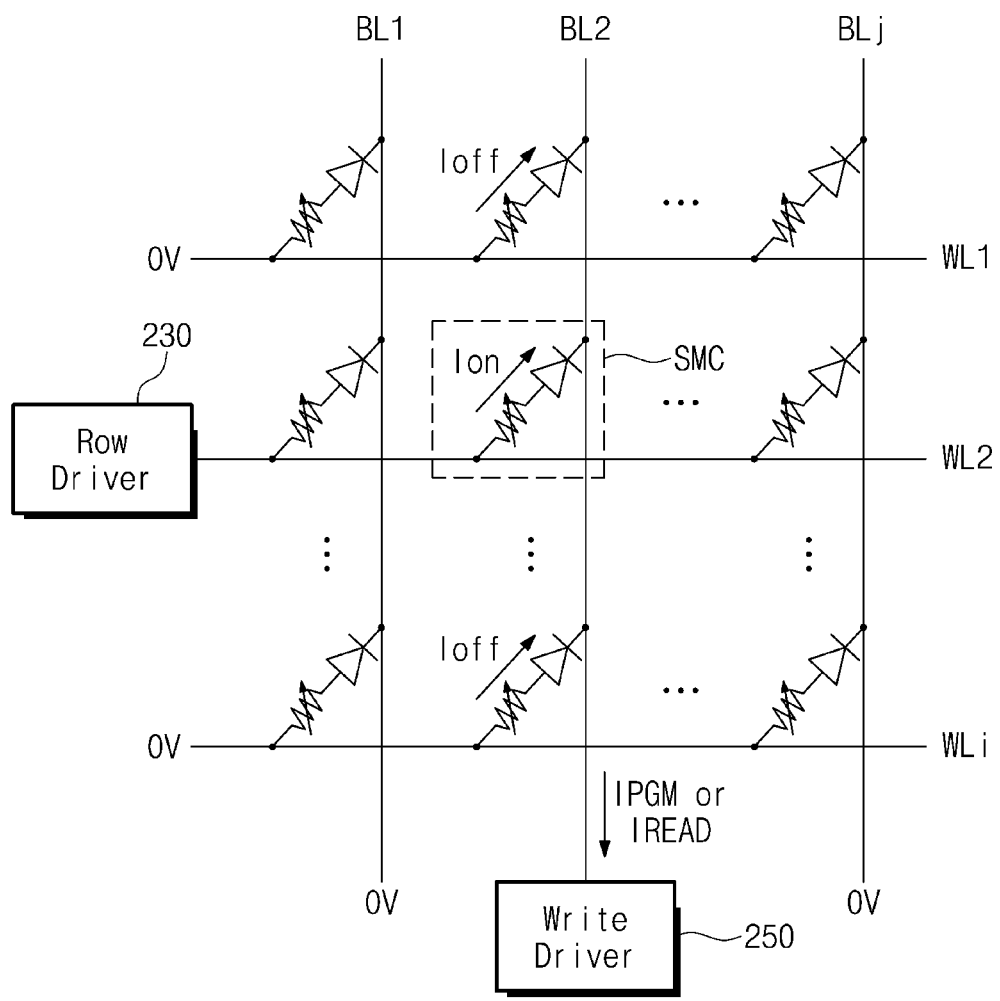
FIG. 6 is a diagram illustrating an example in which a program operation or a read operation is performed on a selected memory cell, according to an embodiment of the disclosure.

FIG. 6 is a diagram illustrating an example in which a program operation or a read operation is performed on a selected memory cell, according to an embodiment of the disclosure. Referring to FIG. 6, a memory cell SMC connected to the second word line WL2 and the second bit line BL2 may be selected for the program operation or the read operation.

In the program operation, the row driver 230 may apply a program voltage to the second word line WL2 connected to the selected memory cell SMC, and the write drivers 250 may drive the second bit line BL2 so that a program current IPGM flows to the second bit line BL2 connected to the selected memory cell SMC. In this case, a non-selection voltage (e.g., 0 V) may be applied to the remaining word lines and the remaining bit lines. The write driver 250 may drive the second bit line BL2 based on the operating current Ir provided from the current regulator 170 of FIG. 1. In this case, the operating current Ir may correspond to the program current IPGM.

When the program current IPGM flows to the second bit line BL2, a sum of an ON current Ion flowing through the selected memory cell SMC and OFF currents Ioff flowing through unselected memory cells connected to the second bit line BL2 may be the same as the program current IPGM. The OFF current Ioff flowing through each unselected memory cell may be a leakage current. In this case, there may be required the program current IPGM that allows the ON current Ion flowing through the selected memory cell SMC to have a current level for the reset operation or the set operation.

When a temperature of the nonvolatile memory device 100 varies, a value of the OFF current Ioff flowing through each unselected memory cell may vary. For example, when a temperature increases, a value of the OFF current Ioff may increase. Also, when a temperature of the nonvolatile memory device 100 varies, a value of the ON current Ion necessary for the program operation may vary. For example, when a temperature increases, a value of the ON current Ion necessary for the reset operation or the set operation may decrease. As such, a value of the program current IPGM that is necessary for the program operation may vary depending on a temperature of the nonvolatile memory device 100. That is, a value of the operating current Ir that is transferred to the write driver 250 may vary depending on a temperature.

In the read operation, the row driver 230 may apply a read voltage to the second word line WL2 connected to the selected memory cell SMC, and the write drivers 250 may drive the second bit line BL2 so that a read current IREAD flows to the second bit line BL2 connected to the selected memory cell SMC. In this case, the non-selection voltage (e.g., 0 V) may be applied to the remaining word lines and the remaining bit lines. The write driver 250 may drive the second bit line BL2 based on the operating current Ir provided from the current regulator 170 of FIG. 1. In this case, the operating current Ir may correspond to the read current IREAD.

When the read current IREAD flows to the second bit line BL2, a sum of the ON current Ion flowing through the selected memory cell SMC and the OFF currents Ioff flowing through the unselected memory cells connected to the second bit line BL2 may be the same as the read current IREAD. The OFF current Ioff flowing through each unselected memory cell may be a leakage current. In this case, there may be required the read current IREAD that allows the ON current Ion flowing through the selected memory cell SMC to have a current level for the read operation.

When a temperature of the nonvolatile memory device 100 varies, a value of the OFF current Ioff flowing through each unselected memory cell may vary. Also, when a temperature of the nonvolatile memory device 100 varies, a value of the ON current Ion necessary for the read operation may vary. As such, a value of the read current IREAD that is necessary for the read operation may vary depending on a temperature of the nonvolatile memory device 100. That is, a value of the operating current Ir that is transferred to the write driver 250 may vary depending on a temperature.

As described above, a value of the operating current Ir that is provided to the write driver 250 in the program operation and the read operation may vary depending on a temperature. As described with reference to FIG. 1, the current regulator 170 may regulate a value of the operating current Ir that is provided to the write driver 250. Below, the current regulator 170 that regulates a value of the operating current Ir depending on a temperature will be described with reference to FIGS. 7 to 12.

Figure 7:
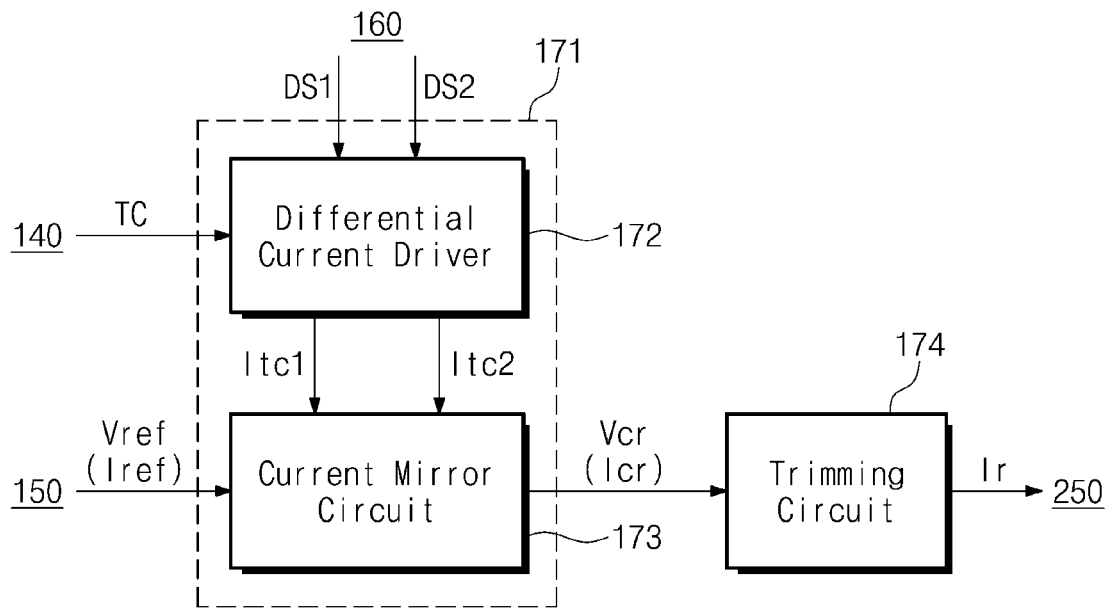
FIG. 7 is an exemplary block diagram of a current regulator of FIG. 1.

FIG. 7 is an exemplary block diagram of a current regulator of FIG. 1. Referring to FIG. 7, the current regulator 170 may include a temperature compensation circuit 171 and a trimming circuit 174. The temperature compensation circuit 171 may include a differential current driver 172 and a current mirror circuit 173.

The differential current driver 172 may receive the differential signals DS1 and DS2 generated based on a temperature of the nonvolatile memory device 100 from the temperature sensor 160 and may receive the temperature compensation control signal TC from the control logic circuit 140. The differential current driver 172 may generate compensation currents Itc1 and Itc2 based on the differential signals DS1 and DS2 and the temperature compensation control signal TC. In this case, a difference value between the compensation currents Itc1 and Itc2 may vary depending on the differential signals DS1 and DS2 and the temperature compensation control signal TC. Because the differential signals DS1 and DS2 depend on a temperature, a difference value between the compensation currents Itc1 and Itc2 may vary depending on a temperature.

The current mirror circuit 173 may receive the compensation currents Itc1 and Itc2 from the differential current driver 172. The current mirror circuit 173 may receive the reference voltage Vref corresponding to the reference current Iref from the reference current generator 150. For example, the current mirror circuit 173 may copy the reference current Iref generated from the reference current generator 150 based on the reference voltage Vref. The current mirror circuit 173 may generate a compensation reference current Icr based on the reference current Iref and the compensation currents Itc1 and Itc2. For example, the compensation reference current Icr may have a value obtained by adding a difference value (Itc1−Itc2) of the compensation currents Itc1 and Itc2 to the reference current Iref. When the difference value (Itc1−Itc2) is positive, the compensation reference current Icr may be greater than the reference current Iref. When the difference value (Itc1−Itc2) is negative, the compensation reference current Icr may be smaller than the reference current Iref. In an exemplary embodiment, a sign of the difference value (Itc1−Itc2) may vary depending on the temperature compensation control signal TC. As such, the current mirror circuit 173 may regulate the reference current Iref depending on a temperature of the nonvolatile memory device 100 and may generate the compensation reference current Icr.

The current mirror circuit 173 may output the compensation reference current Icr to the trimming circuit 174. In detail, the current mirror circuit 173 may output the compensation reference current Icr to the trimming circuit 174 by providing a compensation reference voltage Vcr corresponding to the compensation reference current Icr to the trimming circuit 174.

The trimming circuit 174 may receive the compensation reference voltage Vcr corresponding to the compensation reference current Icr from the current mirror circuit 173. For example, the trimming circuit 174 may copy the compensation reference current Icr generated from the current mirror circuit 173 based on the compensation reference voltage Vcr.

The trimming circuit 174 may trim the compensation reference current Icr depending on an operation of the nonvolatile memory device 100 and may generate the operating current Ir. For example, in the program operation, the trimming circuit 174 may trim the compensation reference current Icr and may generate the operating current Ir for performing the reset operation or the set operation. In the read operation, the trimming circuit 174 may trim the compensation reference current Icr and may generate the operating current Ir for performing the read operation.

In a certain operation (e.g., the program operation or the read operation), a value of the operating current Ir generated from the trimming circuit 174 may vary depending on the compensation reference current Icr provided from the temperature compensation circuit 171. That is, a value of the operating current Ir may vary depending on a temperature in a certain operation. For example, the operating current Ir generated for the program operation at a first temperature may be different from the operating current Ir generated for the program operation at a second temperature.

The trimming circuit 174 may output the generated operating current Ir to the write driver 250. For example, the write driver 250 may receive the operating current Ir by copying the operating current Ir generated from the trimming circuit 174.

Figure 8:
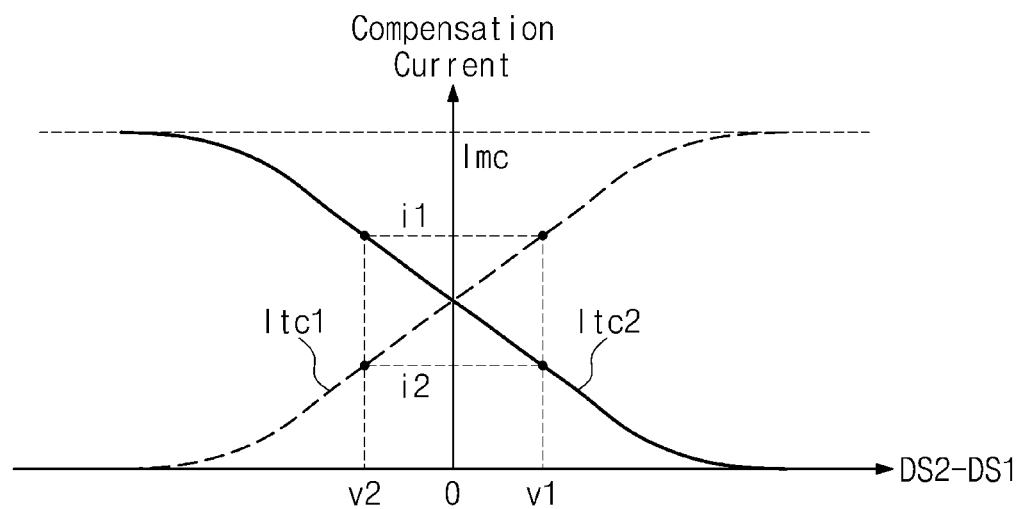
FIG. 8 is a diagram illustrating an example of compensation currents of FIG. 7.

FIG. 8 is a diagram illustrating an example of compensation currents of FIG. 7. In FIG. 8, a horizontal axis represents a difference value (DS2−DS1) between the second differential signal DS2 and the first differential signal DS1, and a vertical axis represents a value of a compensation current. Here, the difference value (DS2−DS1) may correspond to a temperature of the nonvolatile memory device 100.

Referring to FIG. 8, as the difference value (DS2−DS1) increases, the first compensation current Itc1 may increase, while the second compensation current Itc2 may decrease. When the difference value (DS2−DS1) is "0", the first compensation current Itc1 may be the same as the second compensation current Itc2. As the difference value (DS2−DS1) decreases, the first compensation current Itc1 may decrease, while the second compensation current Itc2 may increase. Here, a sum of the first compensation current Itc1 and the second compensation current Itc2 may be a maximum compensation current value Imc. That is, when the difference value (DS2−DS1) varies depending on a temperature, the compensation currents Itc1 and Itc2 may vary within the maximum compensation current value Imc.

In an exemplary embodiment, the maximum compensation current value Imc may be adjusted to adjust the magnitude of the compensation reference current Icr. In detail, the control logic circuit 140 may generate the temperature compensation control signal TC for adjusting the maximum compensation current value Imc. The differential current driver 172 may adjust the magnitudes of the compensation currents Itc1 and Itc2 with the same ratio based on the temperature compensation control signal TC. For example, in the case where each of the compensation currents Itc1 and Itc2 increases with the same ratio based on the temperature compensation control signal TC, the maximum compensation current value Imc may also increase with the same ratio. The current mirror circuit 173 may generate the compensation reference current Icr based on the compensation currents Itc1 and Itc2 adjusted depending on the temperature compensation control signal TC. As such, the compensation reference current Icr that is generated at a certain temperature may vary depending on the temperature compensation control signal TC.

In an exemplary embodiment, the differential signals DS1 and DS2 that are transferred to the differential current driver 172 may be selectively swapped to adjust the magnitude of the compensation reference current Icr. For example, the differential signals DS1 and DS2 may be swapped so that the second differential signal DS2 is transferred to a first input line to which the first differential signal DS1 is transferred and the first differential signal DS1 is transferred to a second input line to which the second differential signal DS2 is transferred. In detail, the control logic circuit 140 may generate the temperature compensation control signal TC for swapping the differential signals DS1 and DS2. The differential current driver 172 may swap the differential signals DS1 and DS2 based on the temperature compensation control signal TC and may generate the compensation currents Itc1 and Itc2. For example, based on the temperature compensation control signal TC, the first differential signal DS1 may be transferred to the first input line, and the second differential signal DS2 may be transferred to the second input line. The differential current driver 172 may generate the first compensation current Itc1 having a first current value i1 and the second compensation current Itc2 having a second current value i2, based on a first value v1 being the difference value (DS2−DS1). In this case, because the first compensation current Itc1 is greater than the second compensation current Itc2, the current mirror circuit 173 may generate the compensation reference current Icr greater than the reference current Iref. For example, based on the temperature compensation control signal TC, the second differential signal DS2 may be transferred to the first input line, and the first differential signal DS1 may be transferred to the second input line. The differential current driver 172 may generate the first compensation current Itc1 having the second current value i2 and the second compensation current Itc2 having the first current value i1, based on a second value v2 being the difference value (DS2−DS1). In this case, because the first compensation current Itc1 is smaller than the second compensation current Itc2, the current mirror circuit 173 may generate the compensation reference current Icr smaller than the reference current Iref. As such, the compensation reference current Icr that is generated at a certain temperature may vary depending on the temperature compensation control signal TC.

Below, a configuration of the temperature compensation circuit 171 of FIG. 7 will be more fully described with reference to FIGS. 9 to 12.

Figure 9:
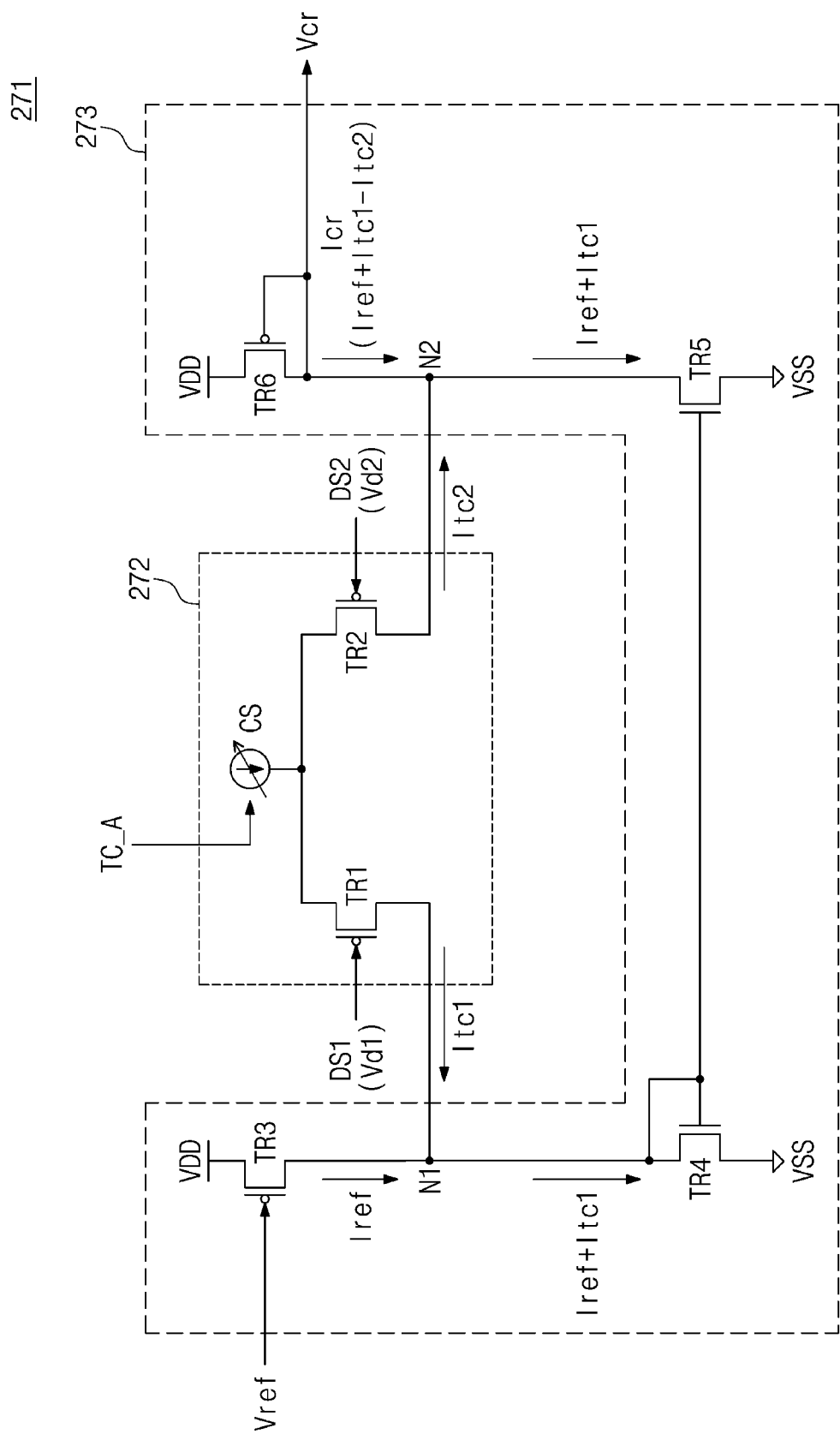
FIG. 9 is a circuit diagram illustrating an example of a temperature compensation circuit of FIG. 7.

FIG. 9 is a circuit diagram illustrating an example of a temperature compensation circuit of FIG. 7. Referring to FIG. 9, a temperature compensation circuit 271 may include a differential current driver 272 and a current mirror circuit 273.

The differential current driver 172 may include a current source CS, a first transistor TR1, and a second current TR2. The current source CS may output a bias current, the magnitude of which is selected based on a temperature compensation magnitude signal TC_A. That is, a level of a current that is output based on the temperature compensation magnitude signal TC_A may be variable.

The temperature compensation magnitude signal TC_A may be included in the temperature compensation control signal TC of FIG. 7. For example, the temperature compensation magnitude signal TC_A may be a binary code. A current that is output from the current source CS may be the same as the maximum compensation current value Imc of FIG. 8. Accordingly, as described with reference to FIG. 8, the maximum compensation current value Imc may be adjusted based on the temperature compensation magnitude signal TC_A.

A first end (or terminal) of the first transistor TR1 may be connected to an output terminal of the current source CS, and a second end thereof may be connected to a first node N1 of the current mirror circuit 273. As the first differential signal DS1, a first differential voltage Vd1 may be applied to a gate terminal of the first transistor TR1. A first end of the second transistor TR2 may be connected to the output terminal of the current source CS, and a second end thereof may be connected to a second node N2 of the current mirror circuit 273. As the second differential signal DS2, a second differential voltage Vd2 may be applied to a gate terminal of the second transistor TR2. That is, the differential voltages Vd1 and Vd2 that are determined depending on a temperature of the nonvolatile memory device 100 may be provided to the first and second transistors TR1 and TR2.

In the case where the first transistor TR1 and the second transistor TR2 have substantially the same characteristic, a current that is output from the current source CS may be distributed into the first transistor TR1 and the second transistor TR2 depending on the differential voltages Vd1 and Vd2. As such, the first transistor TR1 may output the first compensation current Itc1 based on the first differential voltage Vd1, and the second transistor TR2 may output the second compensation current Itc2 based on the second differential voltage Vd2. The first compensation current Itc1 thus output may be provided to the first node N1 of the current mirror circuit 273, and the second compensation current Itc2 thus output may be provided to the second node N2 of the current mirror circuit 273.

The current mirror circuit 273 may include third to sixth transistors TR3 to TR6. A power supply voltage VDD may be applied to a first end of the third transistor TR3, and a second end of the third transistor TR3 may be connected to the first node N1. The reference voltage Vref may be applied to a gate terminal of the third transistor TR3. The third transistor TR3 may generate the reference current Iref based on the reference voltage Vref.

A first end of the fourth transistor TR4 may be connected to the first node N1 and a gate terminal of the fourth transistor TR4, and a ground voltage VSS may be applied to a second end of the fourth transistor TR4. According to the reference current Iref provided to the first node N1 and the first compensation current Itc1, a current that flows from the first node N1 to the fourth transistor TR4 may be a current (Iref+Itc1) being a sum of the reference current Iref and the first compensation current Itc1.

A first end of the fifth transistor TR5 may be connected to the second node N2, and the ground voltage VSS may be applied to a second end of the fifth transistor TR5. A gate terminal of the fifth transistor TR5 may be connected to the gate terminal of the fourth transistor TR4. The fifth transistor TR5 may copy the current (Iref+Itc1) flowing to the fourth transistor TR4 and may generate a current (Iref+Itc1) being the same in value as the current (Iref+Itc1) flowing through the fourth transistor TR4. As such, the current (Iref+Itc1) may flow from the second node N2 to the fifth transistor TR5.

The power supply voltage VDD may be applied to a first end of the sixth transistor TR6, and a second end of the sixth transistor TR6 may be connected to the second node N2. A gate terminal of the sixth transistor TR6 may be connected to the second end of the sixth transistor TR6. The sixth transistor TR6 may generate the compensation reference current Icr and may output the compensation reference current Icr to the second node N2. Because the second compensation current Itc2 is input from the differential current driver 272 to the second node N2 and the current (Iref+Itc1) flows from the second node N2 to the fifth transistor TR5, the compensation reference current Icr may be expressed by Equation 1 below.

$$Icr = Iref + Itc1 - Itc2 \quad \text{[Equation 1]}$$

Referring to Equation 1, the compensation reference current Icr may have a value obtained by adding a difference value (Itc1−Itc2) of the compensation currents Itc1 and Itc2 to the reference current Iref. Because the difference value (Itc1−Itc2) varies depending on the differential voltages Vd1 and Vd2 and the temperature compensation magnitude signal TC_A, the compensation reference current Icr that is based on a temperature of the nonvolatile memory device 100 may be generated through the sixth transistor TR6.

As the compensation reference current Icr is generated, the compensation reference voltage Vcr may be output from the gate terminal of the sixth transistor TR6. The compensation reference voltage Vcr may be provided to the trimming circuit 174 of FIG. 7. As such, the trimming circuit 174 may copy the compensation reference current Icr generated from the current mirror circuit 273 based on the compensation reference voltage Vcr.

According to the temperature compensation circuit 271 of FIG. 9, the difference value (Itc1−Itc2) of the compensation currents Itc1 and Itc2 may be maintained with the same sign at a certain temperature. For example, the difference value (Itc1−Itc2) may be positive at the certain temperature. In this case, the compensation reference current Icr may increase at the certain temperature. However, it is necessary to increase or decrease the compensation reference current Icr at the certain temperature due to various situations such as a memory cell characteristic.

Below, the temperature compensation circuit 271 capable of increasing or decreasing the compensation reference current Icr will be described with reference to FIG. 10.

Figure 10:
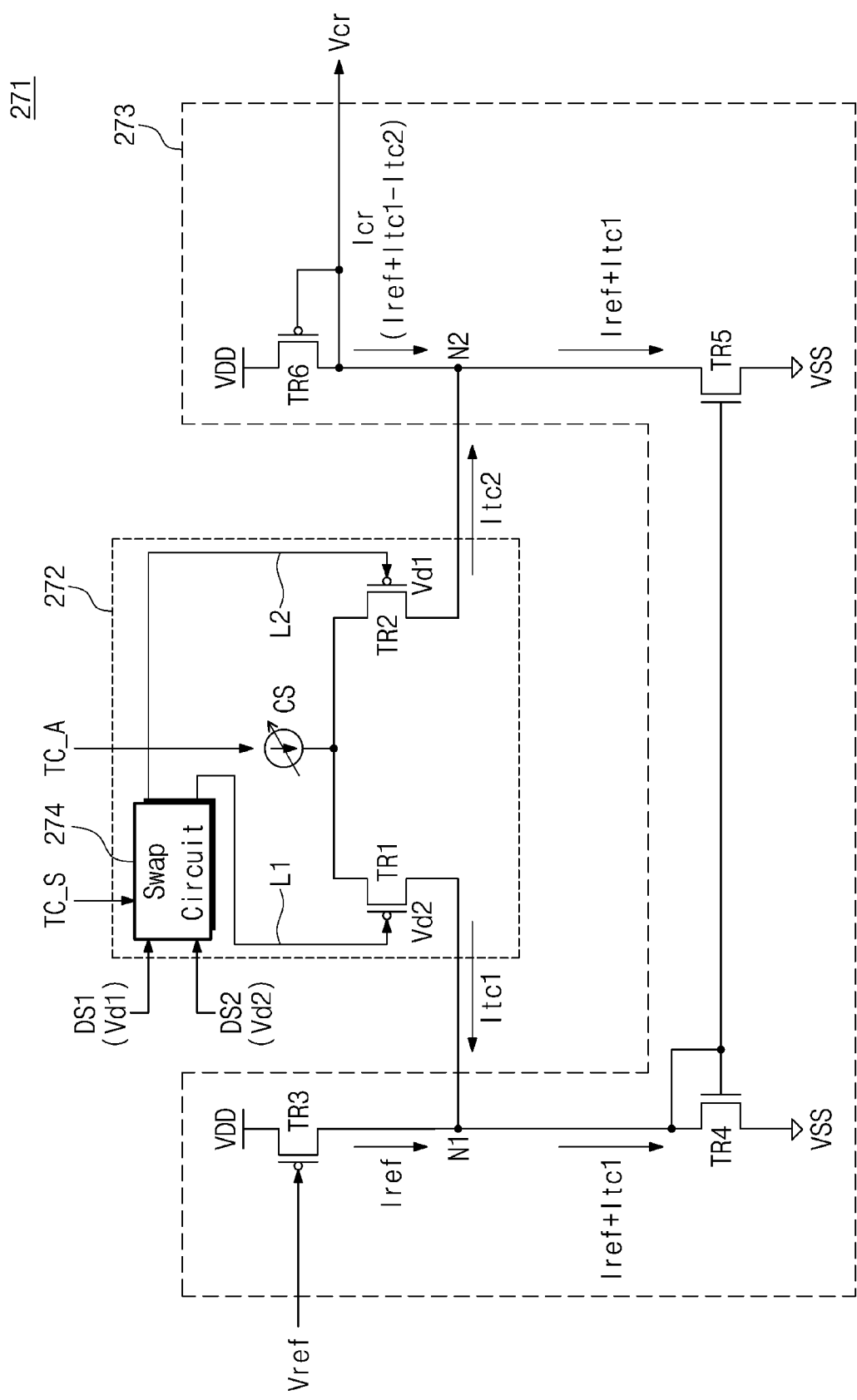
FIG. 10 is a circuit diagram illustrating an additional example of a temperature compensation circuit of FIG. 9.

FIG. 10 is a circuit diagram illustrating an additional example of a temperature compensation circuit of FIG. 9. Referring to FIG. 10, the differential current driver 272 may further include a swap circuit 274. The swap circuit 274 may receive the first differential voltage Vd1 as the first differential signal DS1 and may receive the second differential voltage Vd2 as the second differential signal DS2. Based on a temperature compensation sign signal TC_S, the swap circuit 274 may output one of the differential voltages Vd1 and Vd2 to a first input line L1 and may output the remaining one thereof to a second input line L2. The differential voltages Vd1 and Vd2 respectively transferred to the first and second input lines L1 and L2 may be swapped based on the temperature compensation sign signal TC_S. The first input line L1 may be connected to the gate terminal of the first transistor TR1, and the second input line L2 may be connected to the gate terminal of the second transistor TR2. As such, the differential voltages Vd1 and Vd2 that are respectively transferred to the gate terminals of the first and second transistors TR1 and TR2 may be swapped based on the temperature compensation sign signal TC_S. Here, the temperature compensation magnitude signal TC_A may be included in the temperature compensation control signal TC provided from the control logic circuit 140 of FIG. 7.

As illustrated in FIG. 10, based on the temperature compensation sign signal TC_S, the second differential voltage Vd2 may be applied to the gate terminal of the first transistor TR1, and the first differential voltage Vd1 may be applied to the gate terminal of the second transistor TR2. In this case, compared with FIG. 9, the differential voltages Vd1 and Vd2 may be applied to different gate terminals. The first transistor TR1 may output the first compensation current Itc1 based on the second differential voltage Vd2, and the second transistor TR2 may output the second compensation current Itc2 based on the first differential voltage Vd1. As such, the compensation currents Itc1 and Itc2 output from the differential current driver 172 may have values obtained by swapping values of the compensation currents Itc1 and Itc2 of FIG. 9.

For example, when the difference value (Itc1−Itc2) between the compensation currents Itc1 and Itc2 of FIG. 9 is positive, the difference value (Itc1−Itc2) between the compensation currents Itc1 and Itc2 of FIG. 10 may be a negative number of the same magnitude. In this case, the compensation reference current Icr of FIG. 9 may be greater than the reference current Iref, and the compensation reference current Icr of FIG. 10 may be smaller than the reference current Iref. Accordingly, when the differential signals DS1 and DS2 are swapped by the swap circuit 274, the compensation reference current Icr generated at a certain temperature may change.

As described above, when the input differential signals DS1 and DS2 are swapped depending on the temperature compensation sign signal TC_S, the compensation reference current Icr may become greater or smaller than the reference current Iref.

Figure 11:
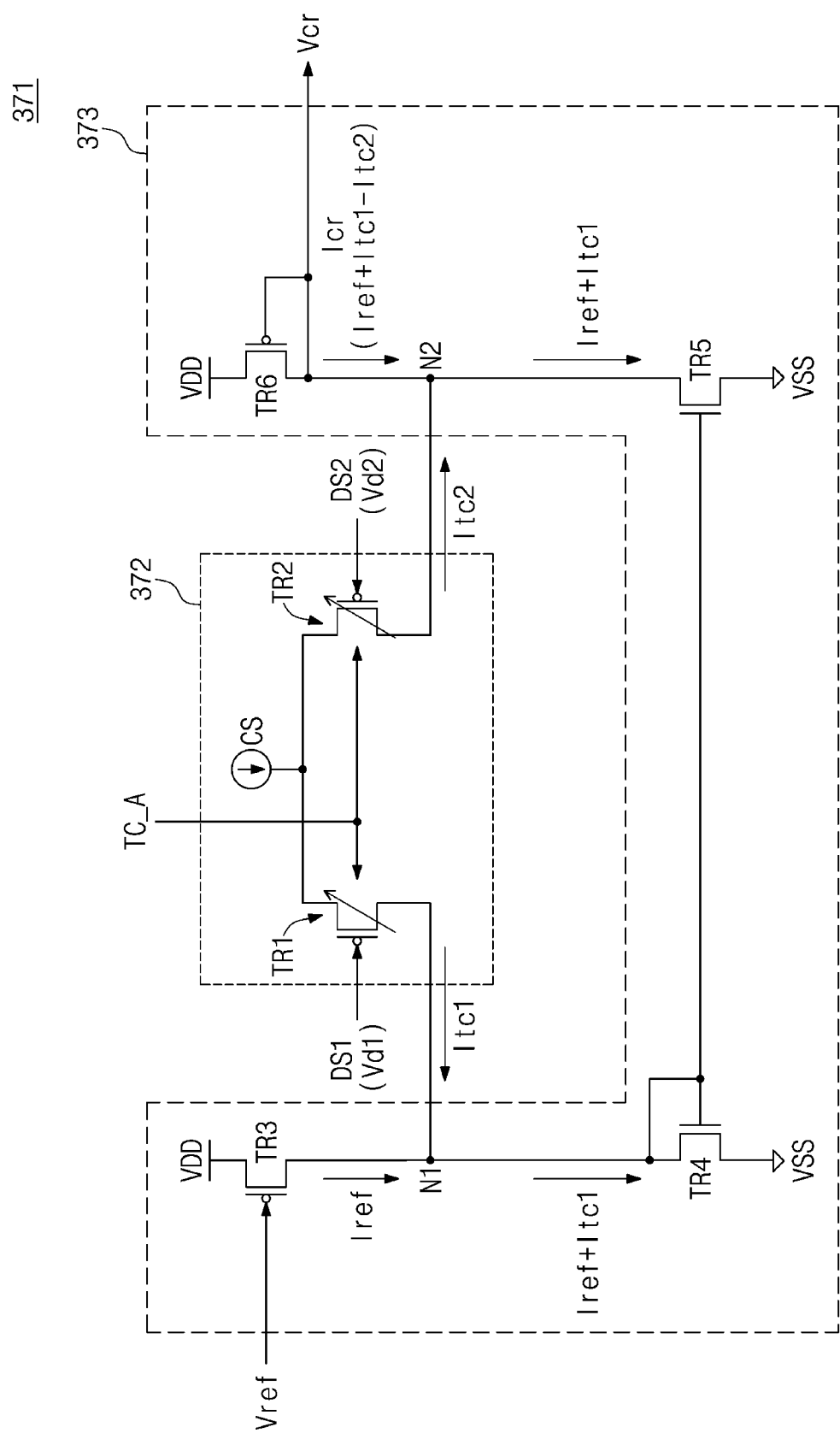
FIG. 11 is a circuit diagram illustrating another example of a temperature compensation circuit of FIG. 7.

FIG. 11 is a circuit diagram illustrating another example of a temperature compensation circuit of FIG. 7. Referring to FIG. 11, a temperature compensation circuit 371 may include a differential current driver 372 and a current mirror circuit 373. Because a configuration of the current mirror circuit 373 is substantially the same as the configuration of the current mirror circuit 273 of FIG. 9, the temperature compensation circuit 371 will be described with reference to the differential current driver 372.

The differential current driver 372 may include the current source CS, the first transistor TR1, and the second current TR2. The current source CS may output a bias current, the magnitude of which is determined in advance. The first differential voltage Vd1 is applied to the gate terminal of the first transistor TR1 as the first differential signal DS1, and the second differential voltage Vd2 is applied to the gate terminal of the second transistor TR2 as the second differential signal DS2.

An example is illustrated in FIG. 11 in which each of the first and second transistors TR1 and TR2 is implemented with one transistor, but each of the first and second transistors TR1 and TR2 may be one transistor, which is selected based on the temperature compensation magnitude signal TC_A, from among a plurality of transistors. In this case, a width of each of the first and second transistors TR1 and TR2 may vary depending on at least one transistor. The widths of the first and second transistors TR1 and TR2 may be selected based on the temperature compensation magnitude signal TC_A. As illustrated in FIG. 11, when the widths of the first and second transistors TR1 and TR2 are selected by the same temperature compensation magnitude signal TC_A, the widths of the first and second transistors TR1 and TR2 may be the same.

When the widths of the first and second transistors TR1 and TR2 are selected, values of the compensation currents Itc1 and Itc2 that the first and second transistors TR1 and TR2 output may be adjusted depending on the selected widths. When the widths of the first and second transistors TR1 and TR2 vary based on the temperature compensation magnitude signal TC_A, values of the compensation currents Itc1 and Itc2 may vary. As such, as described with reference to FIG. 8, the maximum compensation current value Imc may vary, and a value of the compensation reference current Icr may vary.

Although not illustrated in FIG. 11, like the temperature compensation circuit 271 of FIG. 10, the temperature compensation circuit 371 may further include a swap circuit that is able to swap the differential signals DS1 and DS2. In this case, the temperature compensation circuit 371 may swap the input differential signals DS1 and DS2 depending on the temperature compensation sign signal TC_S.

Figure 12:
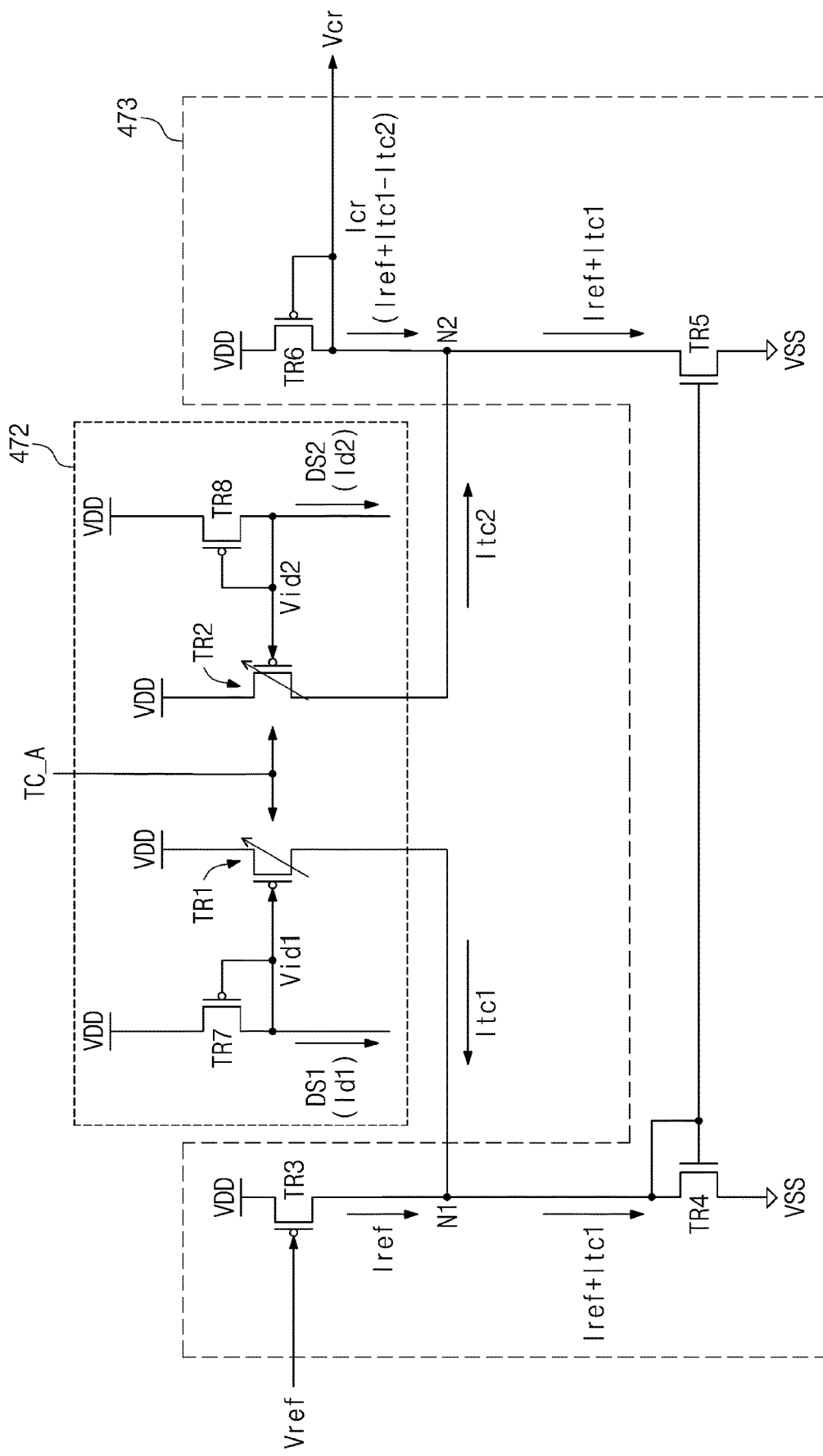
FIG. 12 is a circuit diagram illustrating another example of a temperature compensation circuit of FIG. 7.

FIG. 12 is a circuit diagram illustrating another example of a temperature compensation circuit of FIG. 7. Referring to FIG. 12, a temperature compensation circuit 471 may include a differential current driver 472 and a current mirror circuit 473. Because a configuration of the current mirror circuit 473 is substantially the same as the configuration of the current mirror circuit 273 of FIG. 9, the temperature compensation circuit 471 will be described with reference to the differential current driver 472.

The differential current driver 472 may include first transistor TR1, second transistor TR2, seventh transistor TR7, and eighth transistor TR8. The power supply voltage VDD may be applied to a first end of the seventh transistor TR7, and a second end and a gate terminal of the seventh transistor TR7 may be interconnected. As the first differential signal DS1, a first differential current Id1 may be input to the second end of the seventh transistor TR7. In this case, based on the first differential current Id1, a first differential voltage Vid1 may be generated at the gate terminal of the seventh transistor TR7. The first differential voltage Vid1 thus generated may be provided to a gate terminal of the first transistor TR1.

The power supply voltage VDD may be applied to a first end of the eighth transistor TR8, and a second end and a gate terminal of the eighth transistor TR8 may be interconnected. As the second differential signal DS2, a second differential current Id2 may be input to the second end of the eighth transistor TR8. In this case, based on the second differential current Id2, a second differential voltage Vid2 may be generated at the gate terminal of the eighth transistor TR8. The second differential voltage Vid2 thus generated may be provided to a gate terminal of the second transistor TR2.

The power supply voltage VDD may be applied to a first end of the first transistor TR1, and the first differential voltage Vid1 may be applied to the gate terminal of the first transistor TR1. The first transistor TR1 may output the first compensation current Itc1 based on the first differential voltage Vid1.

The power supply voltage VDD may be applied to a first end of the second transistor TR2, and the second differential voltage Vid2 may be applied to the gate terminal of the second transistor TR2. The second transistor TR2 may output the second compensation current Itc2 based on the second differential voltage Vid2.

Widths of the first and second transistors TR1 and TR2 may be selected based on the temperature compensation magnitude signal TC_A. When the widths of the first and second transistors TR1 and TR2 are selected, values of the compensation currents Itc1 and Itc2 that are output through the first and second transistors TR1 and TR2 may be adjusted depending on the selected widths. As such, as described with reference to FIG. 8, the maximum compensation current value Imc may vary, and a value of the compensation reference current Icr may vary.

Although not illustrated in FIG. 12, like the temperature compensation circuit 271 of FIG. 10, the temperature compensation circuit 471 may further include a swap circuit that is able to swap the differential signals DS1 and DS2. In this case, the temperature compensation circuit 471 may swap the input differential signals DS1 and DS2 depending on the temperature compensation sign signal TC_S. As such, the differential voltages Vid1 and Vid2 that are respectively transferred to the gate terminals of the first and second transistors TR3 and TR4 may be swapped.

As described above, each of the temperature compensation circuits 271, 371, and 471 according to embodiments of the disclosure may generate the compensation currents Itc1 and Itc2 based on the differential currents Id1 and Id2 as well as the differential voltages Vd1 and Vd2 as the differential signals DS1 and DS2.

As described with reference to FIGS. 9 to 12, the temperature compensation circuits 271, 371, and 471 according to embodiments of the disclosure may be implemented with transistors. In this case, the temperature compensation circuits 271, 371, and 471 may not include a capacitor and a feedback loop. Accordingly, power consumption of each of the temperature compensation circuits 271, 371, and 471 according to embodiments of the disclosure may decrease, and the area of each of the temperature compensation circuits 271, 371, and 471 may be minimized. Also, the temperature compensation circuits 271, 371, and 471 are free from a stability issue due to the feedback loop.

Figure 13:
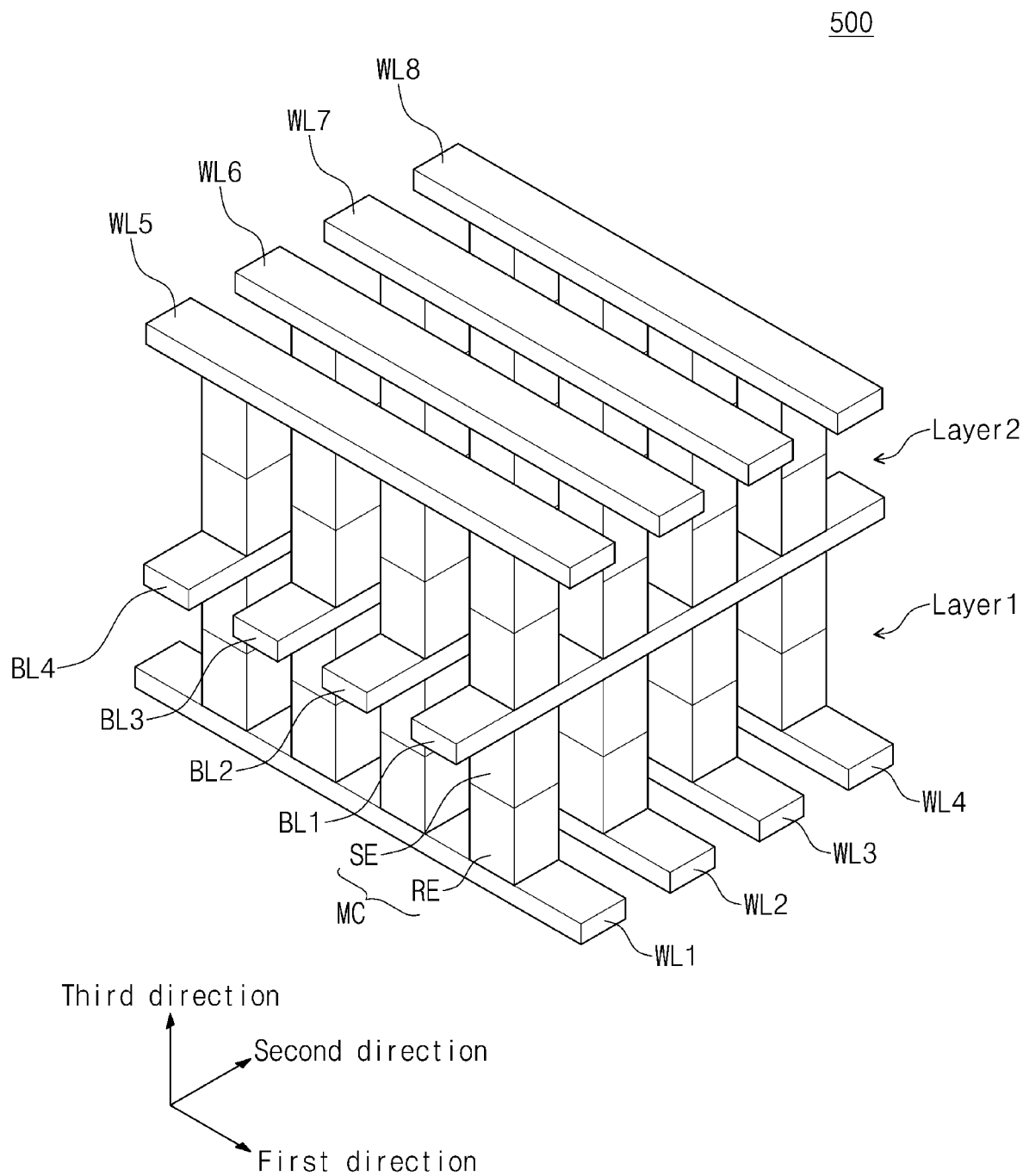
FIG. 13 illustrates a structure of a nonvolatile memory device according to an embodiment of the disclosure.

FIG. 13 illustrates a structure of a nonvolatile memory device according to an embodiment of the disclosure. Referring to FIG. 13, a nonvolatile memory device 500 includes a plurality of memory cells MC. Each memory cell MC may include the selection element SE and the resistance element RE as described with reference to FIG. 4. The memory cell MC may be disposed between a word line extending in a first direction and a bit line extending in a second direction perpendicular to the first direction. In this case, the selection element SE and the resistance element RE may be arranged in a third direction. For example, the resistance element RE may be connected between the first word line WL1 and the selection element SE, and the selection element SE may be connected between the resistance element RE and the first bit line BL1.

The plurality of memory cells MC may be disposed in a first layer (Layer 1) or may be disposed in a second layer (Layer 2). In this case, memory cells MC of the second layer may be stacked in the third direction with respect to memory cells MC of the first layer. As illustrated in FIG. 13, the memory cells MC of the first layer may be connected between first to fourth word lines WL1 to WL4 and first to fourth bit lines BL1 to BL4, and the memory cells MC of the second layer may be connected between fifth to eighth word lines WL5 to WL8 and the first to fourth bit lines BL1 to BL4. In this case, the first to fourth bit lines BL1 to BL4 may be connected to both the memory cells MC of the first layer and the memory cells MC of the second layer. However, the disclosure is not limited thereto. For example, bit lines may be separately provided for each layer.

As described with reference to FIGS. 1 to 12, the nonvolatile memory device 500 may drive a word line or a bit line disposed to cross each other, based on a regulated program current or a regulated read current.

FIG. 13 shows an example of the structure of the nonvolatile memory device 500 in which word lines and bit lines are disposed to cross each other, and the number of word lines, the number of bit lines, and the number of layers may be variously changed or modified.

Figure 14:
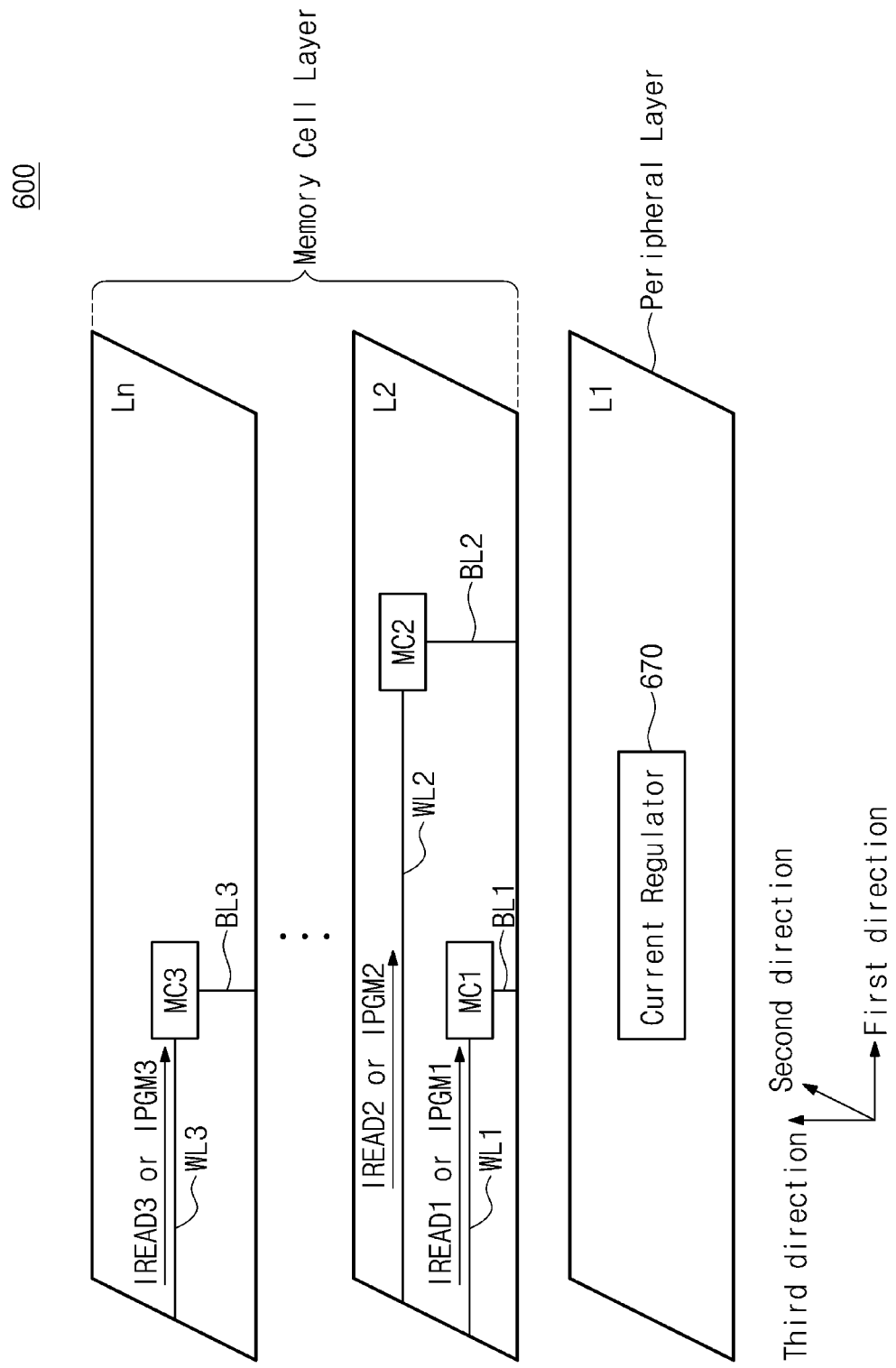
FIG. 14 illustrates an example of a structure of a nonvolatile memory device according to an embodiment of the disclosure.

FIG. 14 illustrates an example of a structure of a nonvolatile memory device according to an embodiment of the disclosure. Referring to FIG. 14, a nonvolatile memory device 600 may include a peripheral layer and a memory cell layer. The peripheral layer may include a first layer L1, and the memory cell layer may include second to n-th layers L2 to Ln.

The peripheral layer may include various peripheral circuits of the nonvolatile memory device 600. For example, as described with reference to FIGS. 1 to 12, the peripheral layer may include a current regulator 670 that regulates an operating current of the nonvolatile memory device 600. The peripheral layer may be disposed at the lowermost end in a direction facing away from the third direction.

The memory cell layer may include a plurality of memory cells. Each of the plurality of memory cells may be connected to a word line and a bit line. The memory cell layer may be disposed on/above the peripheral layer in the third direction. In this case, the second to n-th layers L2 to Ln may be stacked in the third direction. For example, the first layer L1 may be disposed on a first substrate, and the second layer L2 may be disposed on a second substrate. In this case, the second substrate may be disposed on the first layer L1.

As described with reference to FIGS. 1 to 12, the nonvolatile memory device 600 may drive word lines or bit lines disposed in the layers L2 to Ln, based on a regulated program current or a regulated read current. In an exemplary embodiment, the nonvolatile memory device 600 may regulate an operating current for each layer and may drive a word line or a bit line. For example, the nonvolatile memory device 600 may drive a first word line WL1 or a first bit line BL1 connected to a first memory cell MC1 of the second layer L2, based on a first read current IREAD1 or a first program current IPGM1. The nonvolatile memory device 600 may drive a third word line WL3 or a third bit line BL3 connected to a third memory cell MC3 of the n-th layer Ln, based on a third read current IREAD3 or a third program current IPGM3. In this case, at the same temperature, the first read current IREAD1 and the third read current IREAD3 may be different, and the first program current IPGM1 and the third program current IPGM3 may be different. For example, a current may be regulated so that a relatively large current flows to a layer having a relatively high location in the third direction.

In an exemplary embodiment, the nonvolatile memory device 600 may regulate an operating current depending on locations of memory cells in the same layer and may drive a word line or a bit line. For example, in the second layer L2, the first memory cell MC1 may be connected to the first word line WL1 and the first bit line BL1, and the second memory cell MC2 may be connected to the second word line WL2 and the second bit line BL2. In this case, a length of a current path where a current flows from the first word line WL1 to the first bit line BL1 through the first memory cell MC1 may be shorter than a length of a current path where a current flows from the second word line WL2 to the second bit line BL2 through the second memory cell MC2. The nonvolatile memory device 600 may drive the first word line WL1 or the first bit line BL1 connected to the first memory cell MC1 of the second layer L2, based on the first read current IREAD1 or the first program current IPGM1. The nonvolatile memory device 600 may drive the second word line WL2 or the second bit line BL2 connected to the second memory cell MC2 of the second layer L2, based on the second read current IREAD2 or the second program current IPGM2. In this case, at the same temperature, the first read current IREAD1 and the second read current IREAD2 may be different, and the first program current IPGM1 and the second program current IPGM2 may be different. For example, a current may be regulated so that a relatively large current flows to a memory cell corresponding to a current path, the length of which is relatively long.

As described above, the nonvolatile memory device 600 may regulate an operating current for driving a word line or a bit line based on a layer of memory cells and a location of a memory cell, as well as a temperature. An operating current according to a layer and a location may be regulated by the current regulator 670, but the disclosure is not limited thereto. For example, the operating current may be regulated by a separate circuit. As well as the nonvolatile memory device 600 of FIG. 14, nonvolatile memory devices having various structures may regulate an operating current depending on a layer and a location.

Figure 15:
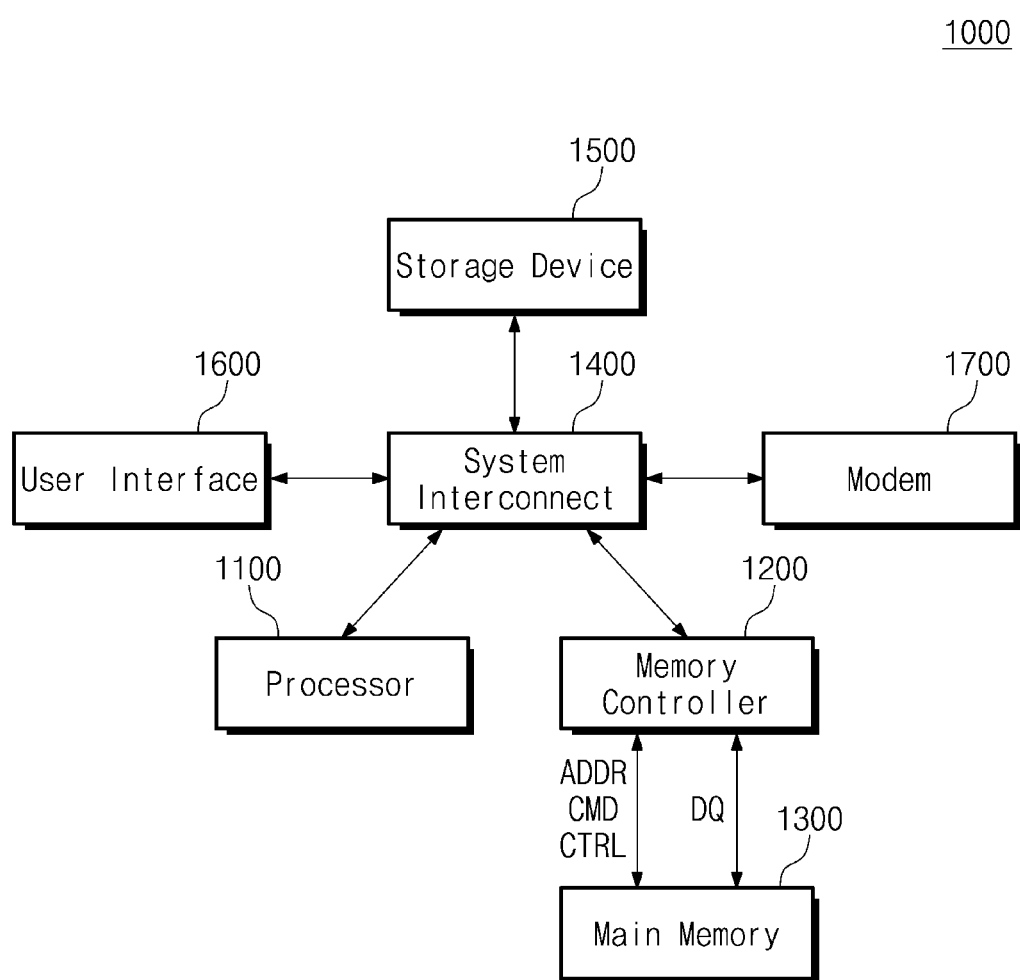
FIG. 15 is a block diagram of a computing device to which a nonvolatile memory device according to an embodiment of the disclosure is applied.

FIG. 15 is a block diagram of a computing device to which a nonvolatile memory device according to an embodiment of the disclosure is applied. Referring to FIG. 15, a computing device 1000 may include a processor 1100, a memory controller 1200, a main memory 1300, a system interconnect 1400, a storage device 1500, a user interface 1600, and a modem 1700. The computing device 1000 may be implemented with one of various computing devices such as a desktop computer, a notebook computer, a data server, an application server, a smartphone, and a smart tablet.

The processor 1100 may be a central processing unit (CPU) or an application processor (AP) that performs various operations. The processor 1100 may control the respective components of the computing device 1000 so as to perform a program operation, a read operation, or any other operation. For example, the processor 1100 may access the main memory 1300 by using the memory controller 1200.

The memory controller 1200 may allow the main memory 1300 to perform a program operation or a read operation under control of the processor 1100. For example, the memory controller 1200 may provide the command CMD, the address ADDR, and the control signal CTRL to the main memory 1300 so that the data signals DQ are stored therein.

The main memory 1300 may receive the address ADDR, the command CMD, and the control signal CTRL from the memory controller 1200. The main memory 1300 may exchange the data signals DQ with the memory controller 1200. The main memory 1300 may include one of the nonvolatile memory devices 100, 500, and 600 described with reference to FIGS. 1 to 14. For example, the main memory 1300 may generate compensation currents based on differential signals according to a temperature of the main memory 1300. The main memory 1300 may regulate a current necessary for the program operation or the read operation, based on the generated compensation currents.

The system interconnect 1400 may provide channels between the components of the computing device 1000. The system interconnect 1400 may be implemented in compliance with one of various standards such as peripheral component interconnect express (PCIe) and advanced microcontroller bus architecture (AMBA).

The storage device 1500 may function as a secondary memory of the computing device 1000. The storage device 1500 may have a slower access speed than the main memory 1300 and may have a higher storage capacity than the main memory 1300. The storage device 1500 may include a hard disk drive (HDD), a solid state drive (SSD), a portable memory, etc.

The user interface 1600 may exchange information with a user. The user interface 2400 may include a user input interface, which receives information from the user, such as a keyboard, a mouse, a touch panel, or a microphone, and a user output interface, which provides information to the user, such as a monitor, a speaker, or a motor.

The modem 1700 is configured to perform wired or wireless communication with an external device. The modem 1700 may be configured to implement at least one of various standards such as long term evolution (LTE), Ethernet, wireless-fidelity (Wi-Fi), and Bluetooth. In an exemplary embodiment, the modem 1700 may be included within the processor 1100.

A nonvolatile memory device according to the disclosure may include a temperature compensation circuit that regulates a current associated with an operation of the nonvolatile memory device depending on a temperature of the nonvolatile memory device.

Also, because the temperature compensation circuit included in the nonvolatile memory device of the disclosure is implemented with transistors without a capacitor, the area of the temperature compensation circuit may become smaller, and power consumption may decrease.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While the disclosure has been described with reference to exemplary embodiments thereof, it will be apparent to those of ordinary skill in the art that various changes and modifications may be made thereto without departing from the spirit and scope of the disclosure as set forth in the following claims.

What is claimed is:
1. A nonvolatile memory device comprising:
   a memory cell array including a plurality of memory cells;
   a temperature sensor configured to sense a temperature and to generate a first differential signal and a second differential signal which are based on the sensed temperature;
   a reference current generator configured to generate a reference current;
   a current mirror circuit configured to generate a first compensation current and a second compensation current corresponding to a difference value between the first and second differential signals, to copy a first current that is a sum of the reference current and the first compensation current to generate a second current having a same value as a value of the first current, and to regulate the reference current depending on a difference value of the second current and the second compensation current; and
   a write driver configured to drive a bit line or a word line connected to the memory cell array based on the regulated reference current.
2. The nonvolatile memory device of claim 1, further comprising a control logic circuit configured to generate a temperature compensation magnitude signal for regulating a maximum compensation current value that is a sum of the first compensation current and the second compensation current.

3. The nonvolatile memory device of claim 2, wherein the current mirror circuit includes:
- a current source configured to output a bias current of the maximum compensation current value based on the temperature compensation magnitude signal;
- a first transistor connected to an output terminal of the current source and configured to output the first compensation current based on the first differential signal; and
- a second transistor connected to the output terminal of the current source and configured to output the second compensation current based on the second differential signal.

4. The nonvolatile memory device of claim 1, further comprising a control logic circuit configured to generate a temperature compensation sign signal for selectively swapping the first differential signal and the second differential signal to be input to the current mirror circuit.

5. The nonvolatile memory device of claim 4, wherein the current mirror circuit includes:
- a swap circuit configured to transfer one of the first differential signal and the second differential signal to a first input line as a first swap differential signal and the other thereof to a second input line as a second swap differential signal, based on the temperature compensation sign signal;
- a current source configured to output a bias current;
- a first transistor connected to an output terminal of the current source and configured to output one of the first compensation current and the second compensation current based on the first swap differential signal provided through the first input line; and
- a second transistor connected to the output terminal of the current source and configured to output the other of the first compensation current and the second compensation current based on the second swap differential signal provided through the second input line.

6. The nonvolatile memory device of claim 1, wherein the current mirror circuit includes:
- a first transistor configured to output the reference current based on a reference voltage provided from the reference current generator;
- a second transistor configured to receive the first current that is a sum of the reference current output from the first transistor and the first compensation current;
- a third transistor configured to copy the first current to generate the second current; and
- a fourth transistor configured to generate the regulated reference current corresponding to the difference value of the second current and the second compensation current.

7. A nonvolatile memory device comprising:
- a memory cell;
- a current regulator that generates a compensation current representing a temperature of the memory cell;
- a trimming circuit that modifies an operating current for performing a read/write operation on the memory cell to generate a modified operating current; and
- a read/write circuit that performs a read/write operation on the memory cell based on the modified operating current.

8. The nonvolatile memory device of claim 7, wherein a maximum amplitude of the compensation current generated by the current regulator is determined by a temperature compensation signal received by the current regulator.

9. The nonvolatile memory device of claim 7, wherein the memory cell is a phase change memory cell.

10. The nonvolatile memory device of claim 7, wherein the current regulator comprises:
- a differential current driver that receives a differential voltage signal pair representing the temperature of the memory cell and generates a first current corresponding to a first voltage of the differential voltage signal pair and a second current corresponding to a second voltage of the differential voltage signal pair; and
- a current mirror circuit that generates the compensation current from a difference between the first current and the second current.

11. The nonvolatile memory device of claim 10, wherein a maximum amplitude of each of the first current and the second current is determined by a temperature compensation signal received by the differential current driver.

12. The nonvolatile memory device of claim 11, wherein the differential current driver receives the temperature compensation signal from an external device that instructed the nonvolatile memory device to perform the read/write operation.

13. The nonvolatile memory device of claim 12, wherein:
- the read/write circuit communicates data stored by the memory cell to the external device in response to the read/write operation being a read operation, and
- the read/write circuit stores data in the memory cell that is received from the external device in response to the read/write operation being a write operation.

14. The nonvolatile memory device of claim 11, wherein:
- the differential current driver comprises a variable current source, a first transistor, and a second transistor,
- the temperature compensation signal controls a bias current output by a variable current source to each of the first transistor and the second transistor,
- the first transistor generates the first current based on the first voltage and the bias current, and
- the second transistor generates the second current based on the second voltage and the bias current.

15. The nonvolatile memory device of claim 10, wherein:
- the differential current driver comprises a current source, multiple first transistors having different widths, and multiple second transistor having different widths,
- the temperature compensation signal controls which of the multiple first transistors is a selected first transistor that receives a bias current generated by current source and which of the multiple second transistors is a selected second transistor that receives the bias current generated by current source,
- the selected first transistor generates the first current based on the first voltage and the bias current, and
- the selected second transistor generates the second current based on the second voltage and the bias current.

* * * * *